(12) United States Patent
Hirao et al.

(10) Patent No.: US 11,774,476 B2
(45) Date of Patent: Oct. 3, 2023

(54) INPUT CAPACITANCE MEASUREMENT CIRCUIT AND METHOD OF MANUFACTURING SEMICONDUCTOR DEVICE

(71) Applicant: Mitsubishi Electric Corporation, Tokyo (JP)

(72) Inventors: Masayoshi Hirao, Fukuoka (JP); Masaki Ueno, Tokyo (JP); Reona Furukawa, Fukuoka (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 17/751,295

(22) Filed: May 23, 2022

(65) Prior Publication Data
US 2023/0043250 A1    Feb. 9, 2023

(30) Foreign Application Priority Data
Aug. 3, 2021   (JP) ................... 2021-127493

(51) Int. Cl.
*G01R 27/26*   (2006.01)
*G01R 3/00*    (2006.01)

(52) U.S. Cl.
CPC .......... *G01R 27/2605* (2013.01); *G01R 3/00* (2013.01)

(58) Field of Classification Search
CPC ............... G01R 27/2605; G01R 3/00
USPC ............................................ 324/686
See application file for complete search history.

(56) References Cited

U.S. PATENT DOCUMENTS

2015/0260780 A1* 9/2015 Osanai ............... H02M 1/08
                                                 324/762.01

FOREIGN PATENT DOCUMENTS

JP    2017-090266 A    5/2017

* cited by examiner

*Primary Examiner* — Farhana A Hoque
(74) *Attorney, Agent, or Firm* — Studebaker & Brackett PC

(57) ABSTRACT

An input capacitance measurement circuit includes a transformer, a first capacitor, a second capacitor, and a third capacitor. A primary wire of the transformer has a first end provided so as to be connectable to an anode of the semiconductor device. The primary wire of the transformer has a second end connected to a first end of the first capacitor. A secondary wire of the transformer has a first end provided so as to be connectable to a cathode of the semiconductor device. The secondary wire of the transformer has a second end connected to a first end of the second capacitor. The third capacitor has a first end provided so as to be connectable to the cathode of the semiconductor device. A second end of the first capacitor, a second end of the second capacitor, and a second end of the third capacitor are electrically connected to each other.

19 Claims, 21 Drawing Sheets

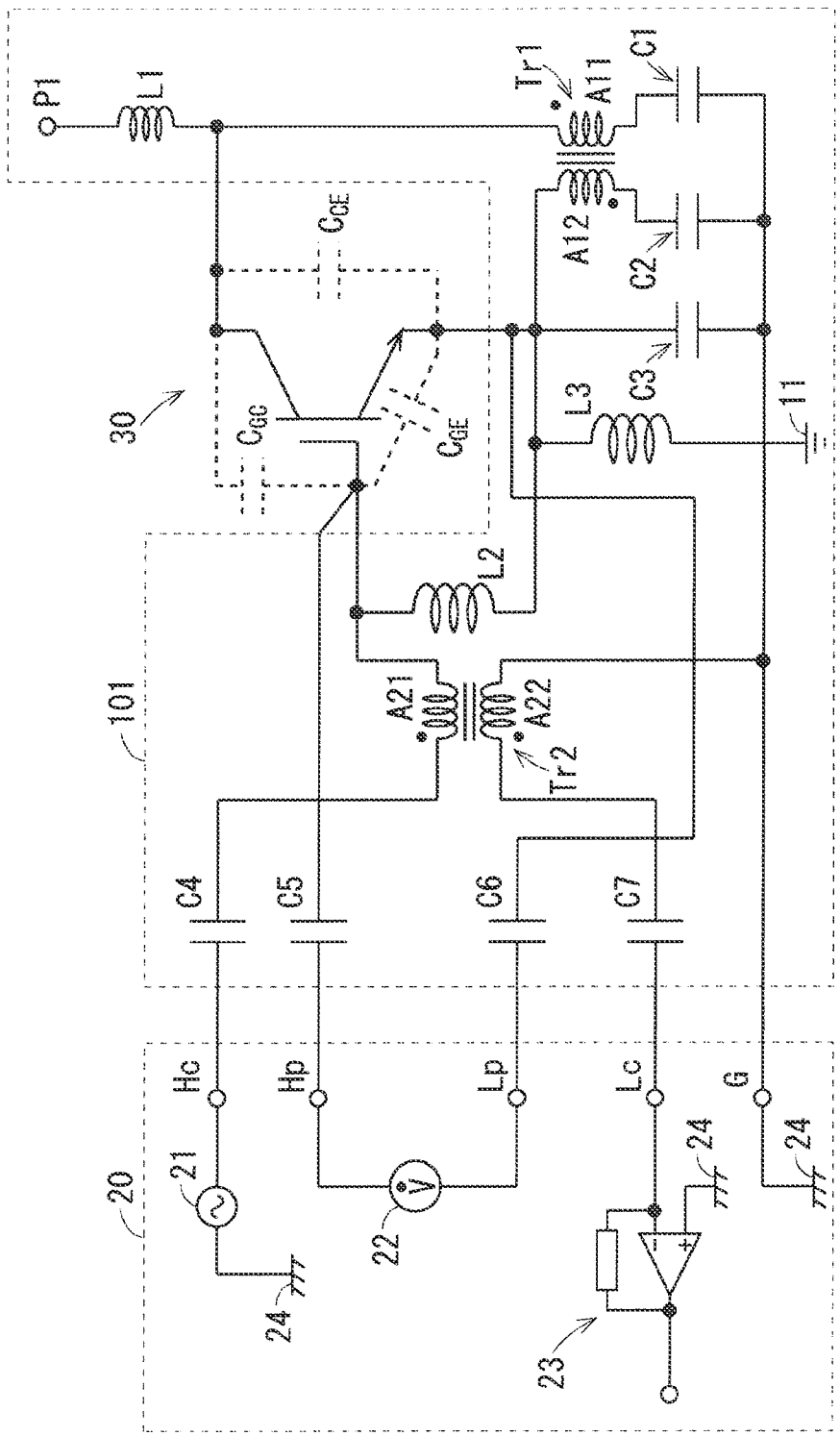
F I G. 1

F I G. 12
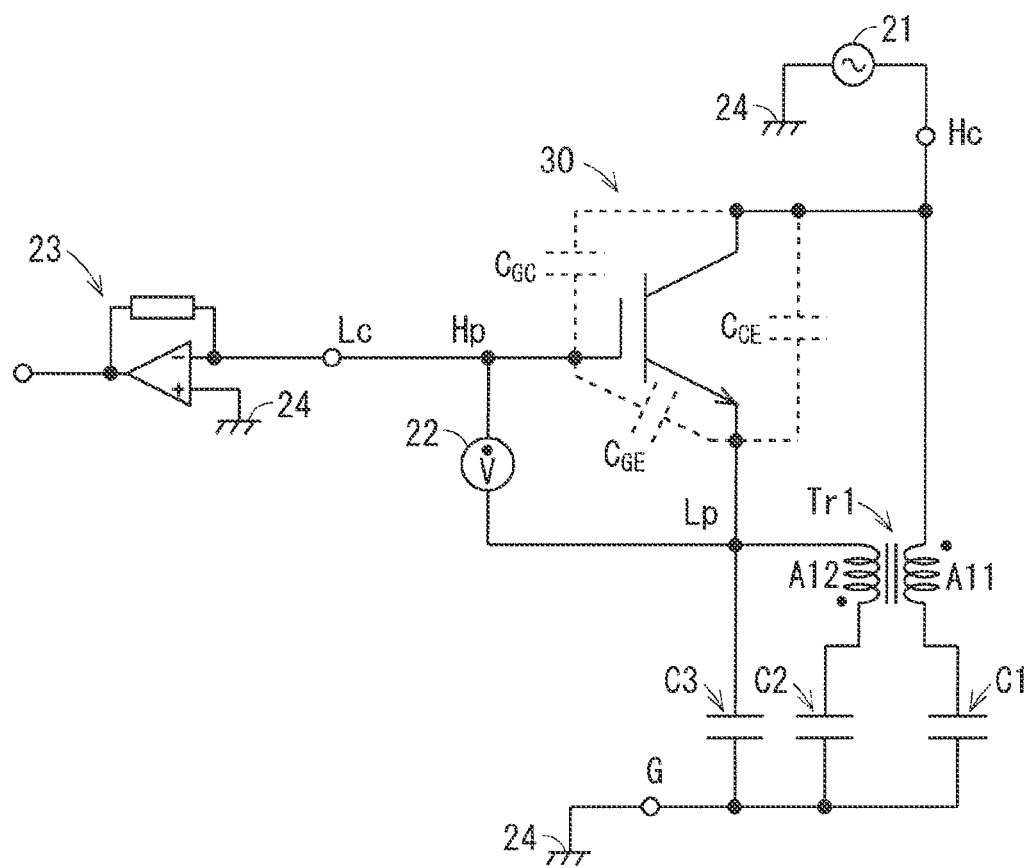

INPUT CAPACITANCE MEASUREMENT CIRCUIT AND METHOD OF MANUFACTURING SEMICONDUCTOR DEVICE

BACKGROUND OF THE INVENTION

Field of the Invention

The present disclosure relates to an input capacitance measurement circuit and a method of manufacturing a semiconductor device.

Description of the Background Art

Japanese Patent Application Laid-Open No. 2017-090266 discloses a method of measuring a parasitic capacitance of a semiconductor device. In Japanese Patent Application Laid-Open No. 2017-090266, a circuit for measuring an input capacitance of the semiconductor device includes a bypass capacitor between a collector electrode and an emitter electrode. The capacitance of the bypass capacitor is sufficiently large for the parasitic capacitance between the collector and the emitter, and also sufficiently large for the parasitic capacitance between the gate and the collector. For this reason, the measurement circuit is regarded as an equivalent circuit in which the gate-collector parasitic capacitance and the gate-emitter parasitic capacitance are connected in parallel. The input capacitance of the semiconductor device is measured by the equivalent circuit.

In the method of measuring a parasitic capacitance disclosed in Japanese Patent Application Laid-Open No. 2017-090266, it is necessary to increase the breakdown voltage of the bypass capacitor as the voltage applied between the collector and the emitter increases. However, increasing the breakdown voltage of the bypass capacitor while maintaining the capacitance of the bypass capacitor causes an increase in dimensions of the bypass capacitor, which in turn increases the dimensions of the measurement device. On the other hand, decreasing the capacitance of the bypass capacitor while maintaining the breakdown voltage of the bypass capacitor suppresses the increase in dimensions of the bypass capacitor. However, the decrease in the capacitance of the bypass capacitor causes an increase in measurement error of the input capacitance of the semiconductor device.

SUMMARY

It is therefore an object of the present disclosure to provide an input capacitance measurement circuit that improves the accuracy of measurement of an input capacitance of a semiconductor device.

An input capacitance measurement circuit according to the present disclosure measures an input capacitance of a semiconductor device. The input capacitance measurement circuit includes: a transformer having a primary wire and a secondary wire; a first capacitor; a second capacitor; and a third capacitor. The primary wire of the transformer has a first end provided so as to be connectable to an anode of the semiconductor device. The primary wire of the transformer has a second end connected to a first end of the first capacitor. The secondary wire of the transformer has a first end provided so as to be connectable to a cathode of the semiconductor device. The secondary wire of the transformer has a second end connected to a first end of the second capacitor. The third capacitor has a first end provided so as to be connectable to the cathode of the semiconductor device. A second end of the first capacitor, a second end of the second capacitor, and a second end of the third capacitor are electrically connected to each other.

The input capacitance measurement circuit according to the present disclosure improves the accuracy of measurement of the input capacitance of the semiconductor device.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 1 is a circuit diagram showing a configuration of an input capacitance measurement system according to a first preferred embodiment;

FIG. 12 is a circuit diagram related to an operation that the input capacitance measurement system performs on high-frequency signals;

DESCRIPTION OF THE PREFERRED EMBODIMENTS

First Preferred Embodiment

Figure 2:
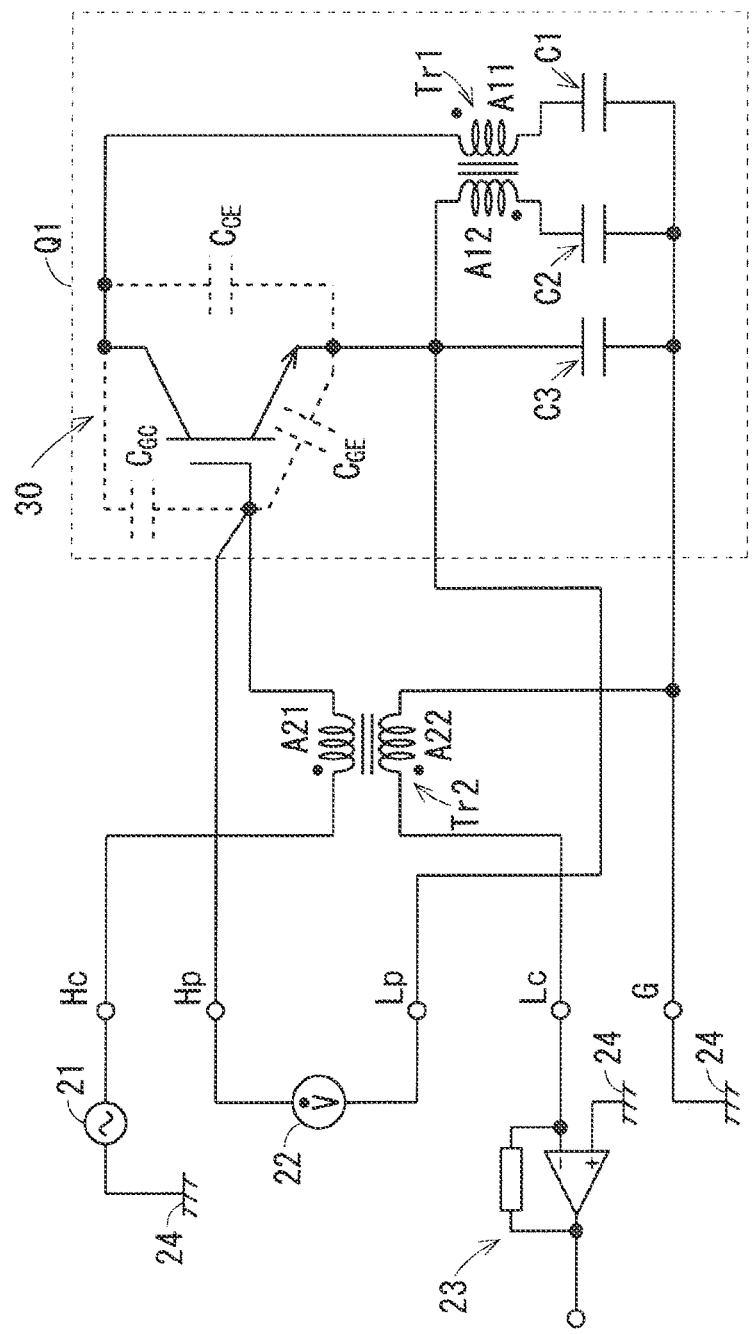
FIG. 2 is a circuit diagram related to an operation that the input capacitance measurement system performs on high-frequency signals.

FIG. 1 is a circuit diagram showing a configuration of an input capacitance measurement system according to a first preferred embodiment. The input capacitance measurement system includes an input capacitance measurement circuit 101 and an LCR meter 20. The input capacitance measurement circuit 101 is a circuit for measuring an input capacitance of a semiconductor device. The semiconductor device includes a switching element. The switching element used herein is an IGBT (Insulated Gate Bipolar Transistor) 30, but is not limited to this. The switching element may be, for example, a MOSFET (Metal Oxide Semiconductor Field Effect Transistor) and the like. A parasitic capacitance $C_{GC}$ between the gate and collector of the IGBT 30, a parasitic capacitance $C_{GE}$ between the gate and emitter thereof, and a parasitic capacitance $C_{CE}$ between the collector and emitter thereof are shown by dotted lines in the circuit diagram of FIG. 1.

The input capacitance measurement circuit 101 includes a first reactor L1, a second reactor L2, a third reactor L3, a first transformer Tr1, a second transformer Tr2, and first to seventh capacitors C1 to C7. The first to seventh capacitors C1 to C7 are, for example, block capacitors, but are not limited to the block capacitors. It is preferable that the first to seventh capacitors C1 to C7 are capacitors for high voltage specifications.

The first reactor L1 connects a terminal P1 and the collector electrode of the IGBT 30. The terminal P1 is a terminal for applying a power supply voltage $V_{CC}$ that is a high direct-current voltage. The first reactor L1 blocks high-frequency signals.

The second reactor L2 connects the gate and emitter electrodes of the IGBT 30. The second reactor L2 blocks high-frequency signals.

The third reactor L3 connects the emitter electrode of the IGBT 30 and a power GND 11. The GND refers to a ground. The third reactor L3 blocks high-frequency signals. In other words, the third reactor L3 prevents current associated with high-frequency signals from flowing from the emitter electrode to the power GND 11.

The first transformer Tr1 includes a primary wire A11 and a secondary wire A12. The second transformer Tr2 includes a primary wire A21 and a secondary wire A22. Each of the primary wires A11 and A21 includes a primary coil, and each of the secondary wires A12 and A22 includes a secondary coil. In FIG. 1, a dot added to each of the primary wires A11 and A21 and the secondary wires A12 and A22 represents polarity. A terminal on the side where the dot is added thereto is referred to as a dot-side electrode. A terminal on the opposite side of the dot-side electrode is referred to as an opposite-side electrode. The second transformer Tr2 is also referred to as a current signal generating transformer.

The dot-side electrode of the primary wire A11, i.e. a first end of the primary wire A11, of the first transformer Tr1 is connected to the collector electrode of the IGBT 30.

The opposite-side electrode of the primary wire A11, i.e. a second end of the primary wire A11, of the first transformer Tr1 is connected to a first end of the first capacitor C1.

The opposite-side electrode of the secondary wire A12, i.e. a first end of the secondary wire A12, of the first transformer Tr1 is connected to the emitter electrode of the IGBT 30.

The dot-side electrode of the secondary wire A12, i.e. a second end of the secondary wire A12, of the first transformer Tr1 is connected to a first end of the second capacitor C2.

A first end of the third capacitor C3 is connected to the emitter electrode of the IGBT 30.

A second end of the first capacitor C1, a second end of the second capacitor C2, and a second end of the third capacitor C3 are electrically connected to each other and are at the same potential.

The opposite-side electrode of the primary wire A21, i.e. a first end of the primary wire A21, of the second transformer Tr2 is connected to the gate electrode of the IGBT 30.

The opposite-side electrode of the secondary wire A22, i.e. a first end of the secondary wire A22, of the second transformer Tr2 is electrically connected to the second end of the first capacitor C1, the second end of the second capacitor C2, and the second end of the third capacitor C3. The first end of the secondary wire A22 of the second transformer Tr2 is connected to a connection point at which three ends, e.g. the second end of the first capacitor C1, the second end of the second capacitor C2, and the second end of the third capacitor C3, are connected to each other. In other words, four ends, i.e. the second end of the first capacitor C1, the second end of the second capacitor C2, the second end of the third capacitor C3, and the opposite-side electrode of the secondary wire A22 of the second transformer Tr2, are connected to each other at that connection point.

The number of turns of the primary coil of the first transformer Tr1 is equal to the number of turns of the secondary coil of the first transformer Tr1. The number of turns of the primary coil of the second transformer Tr2 is equal to the number of turns of the secondary coil of the second transformer Tr2. The primary wire A11 and the secondary wire A12 of the first transformer Tr1 are tightly coupled to each other, so that no magnetic flux leakage occurs. The primary wire A21 and the secondary wire A22 of the second transformer Tr2 are tightly coupled to each other, so that no magnetic flux leakage occurs.

The breakdown voltages of the first and second capacitors C1 and C2 are sufficiently higher than the power supply voltage $V_{CC}$ applied between the terminal P1 and the power GND 11. The capacitance of the first capacitor C1 is equal to the capacitance of the second capacitor C2.

The LCR meter 20 includes a signal generator 21, a vector voltmeter 22, a current-to-voltage converter circuit 23 (referred to hereinafter as an I-V converter circuit 23), and a signal GND 24. The LCR meter 20 may be an impedance analyzer.

The signal generator 21 has a signal application terminal Hc connected via the fourth capacitor C4 to the dot-side electrode of the primary wire A21, i.e. a second end of the primary wire A21, of the second transformer Tr2. The signal generator 21 is connected via the fourth capacitor C4 and the primary wire A21 of the second transformer Tr2 to the gate electrode of the IGBT 30 because the opposite-side electrode of the primary wire A21 of the second transformer Tr2 is connected to the gate electrode of the IGBT 30.

The vector voltmeter 22 has a high-side potential measurement terminal Hp connected via the fifth capacitor C5 to the gate electrode of the IGBT 30. The vector voltmeter 22 has a low-side potential measurement terminal Lp connected via the sixth capacitor C6 to the emitter electrode of the IGBT 30. In other words, the vector voltmeter 22 is connected to the gate and emitter electrodes of the IGBT 30.

The I-V converter circuit 23 has a current measurement terminal Lc connected via the seventh capacitor C7 to the dot-side electrode of the secondary wire A22 of the second transformer Tr2. The I-V converter circuit 23 is connected via the secondary wire A22 of the second transformer Tr2 and the aforementioned connection point to a guard terminal G of the signal GND 24.

The guard terminal G of the signal GND 24 is connected to the second end of the first capacitor C1, the second end of the second capacitor C2, the second end of the third capacitor C3, and the opposite-side electrode of the secondary wire A22 of the second transformer Tr2. The guard terminal G is connected to the aforementioned connection point, for example.

In FIG. 1 which shows the connection configuration in an input capacitance measuring state, the input capacitance measurement circuit 101 is connected to the IGBT 30. However, the input capacitance measurement circuit 101 need not be connected to the IGBT 30 in states other than the input capacitance measuring state. For example, the input capacitance measurement circuit 101 may have a terminal (not shown) connectable to the IGBT 30. For example, there may be provided a terminal for connection between the dot-side electrode of the primary wire A11 of the first transformer Tr1 and the collector electrode of the IGBT 30. There may be provided a terminal for connection between the opposite-side electrode of the secondary wire A12 of the first transformer Tr1 and the emitter electrode of the IGBT 30. There may be provided a terminal for connection between the first end of the third capacitor C3 and the emitter electrode of the IGBT 30. There may be provided a terminal for connection between the opposite-side electrode of the primary wire A21 of the second transformer Tr2 and the gate electrode of the IGBT 30. The same applies to the connection between the input capacitance measurement circuit 101 and the LCR meter 20. For example, the input capacitance measurement circuit 101 may have a terminal (not shown) for connection to the LCR meter 20 in states other than the input capacitance measuring state.

Next, an operation that the input capacitance measurement system performs on a direct-current power supply will be described. The IGBT 30 is in an off state because the second reactor L2 makes a short circuit between the gate and emitter of the IGBT 30. The direct-current power supply voltage $V_{CC}$ applied between the terminal P1 and the power GND 11 is applied between the collector and emitter electrodes of the IGBT 30 through the first reactor L1 and the third reactor L3. The collector electrode is also connected to the dot-side electrode of the primary wire A1 of the first transformer Tr1, but the first capacitor C1 is connected to the opposite-side electrode of the primary wire A11 of the first transformer Tr1. As a result, the power supply voltage $V_{CC}$ is blocked. In other words, no voltage is applied between both ends, i.e. the dot-side electrode and the opposite-side electrode, of the primary wire A11 of the first transformer Tr1.

Next, an operation that the input capacitance measurement system performs on a high-frequency signal will be described as a method of measuring the input capacitance in the first preferred embodiment. The high-frequency signal is, for example, a 100-kH signal. For the high-frequency signal, the impedance of each of the first, second, and third reactors L1, L2, and L3 increases, and each of the first, second, and third reactors L1, L2, and L3 may be regarded as being in an open state. Since four-terminal measurement is applied, the fourth to seventh capacitors C4 to C7 may be regarded as being short-circuited, regardless of the impedances of the cables and capacitors connected to the signal application terminal Hc, the high-side potential measurement terminal Hp, the low-side potential measurement terminal Lp, and the current measurement terminal Lc. For purposes of simplifying the description of the operation on the high-frequency signal, the operation of the input capacitance measurement system will be described in which the first to third reactors L1 to L3 are regarded as being open and the fourth to seventh capacitors C4 to C7 are regarded as being short-circuited.

Figure 3:
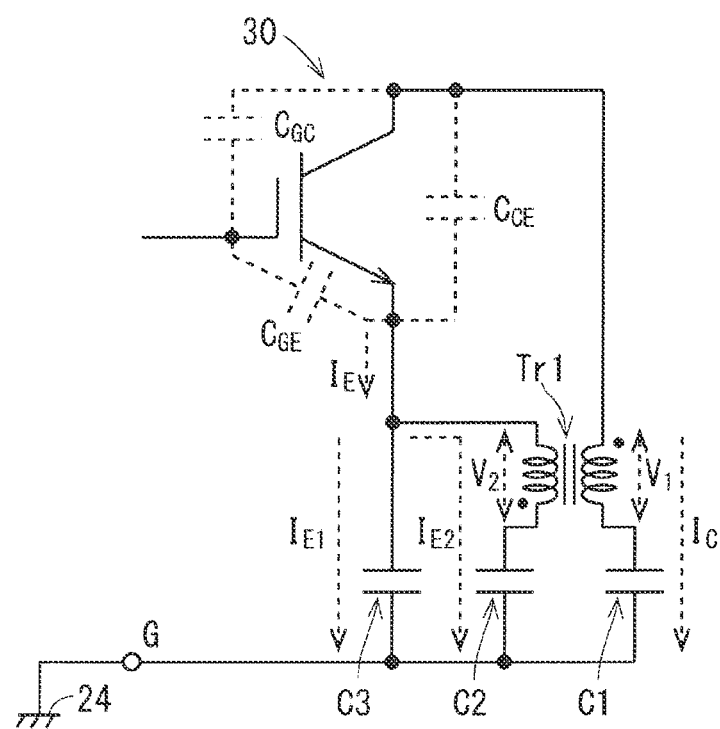
FIG. 3 is an enlarged circuit diagram of a region enclosed by broken lines in FIG. 2.

FIG. 2 is a circuit diagram related to the operation that the input capacitance measurement system performs on high-frequency signals. In FIG. 2, the first to third reactors L1 to L3, the fourth to seventh capacitors C4 to C7, the terminal P1, and the power GND 11 are not shown. FIG. 3 is an enlarged circuit diagram of a region Q1 enclosed by broken lines in FIG. 2.

The collector electrode of the IGBT 30 is connected via the primary wire A11 of the first transformer Tr1 and the first capacitor C1 to the signal GND 24. A current $I_C$ flowing out of the collector electrode flows through the primary wire A11 of the first transformer Tr1 and the first capacitor C1 into the signal GND 24.

The emitter electrode of the IGBT 30 is connected to two paths except for a path connected to the low-side potential measurement terminal Lp of the vector voltmeter 22. One of the two paths is connected via the third capacitor C3 to the signal GND 24. The other path is connected via the secondary wire A12 of the first transformer Tr1 and the second capacitor C2 to the signal GND 24. A current $I_E$ flowing out of the emitter electrode is divided into a current $I_{E1}$ and a current $I_{E2}$. The current $I_{E1}$ flows through the third capacitor C3 into the signal GND 24. The current $I_{E2}$ flows through the secondary wire A12 of the first transformer Tr1 and the second capacitor C2 into the signal GND 24.

A voltage $V_1$ developed across the primary wire A11 is equal to a voltage $V_2$ developed across the secondary wire A12 ($V_1 = V_2$) because the number of turns of the primary coil of the first transformer Tr1 is equal to the number of turns of the secondary coil thereof.

Due to its characteristics, the first transformer Tr1 satisfies the following equation:

$$V_1 \times I_C = V_2 \times I_{E2} \tag{1}$$

Thus, the current $I_C$ flowing through the primary wire A11 is equal to the current $I_{E2}$ flowing through the secondary wire A12 ($I_C = I_{E2}$).

A voltage developed across the first capacitor C1 is equal to a voltage developed across the second capacitor C2 because the capacitance of the first capacitor C1 is equal to the capacitance of the second capacitor C2.

For the aforementioned reasons, a voltage developed between the signal GND 24 and the emitter electrode is equal to a voltage developed between the signal GND 24 and the collector electrode. In other words, the collector electrode and the emitter electrode are at the same potential. Thus, the circuit diagram shown in FIG. 2 is further simplified.

Figure 4:
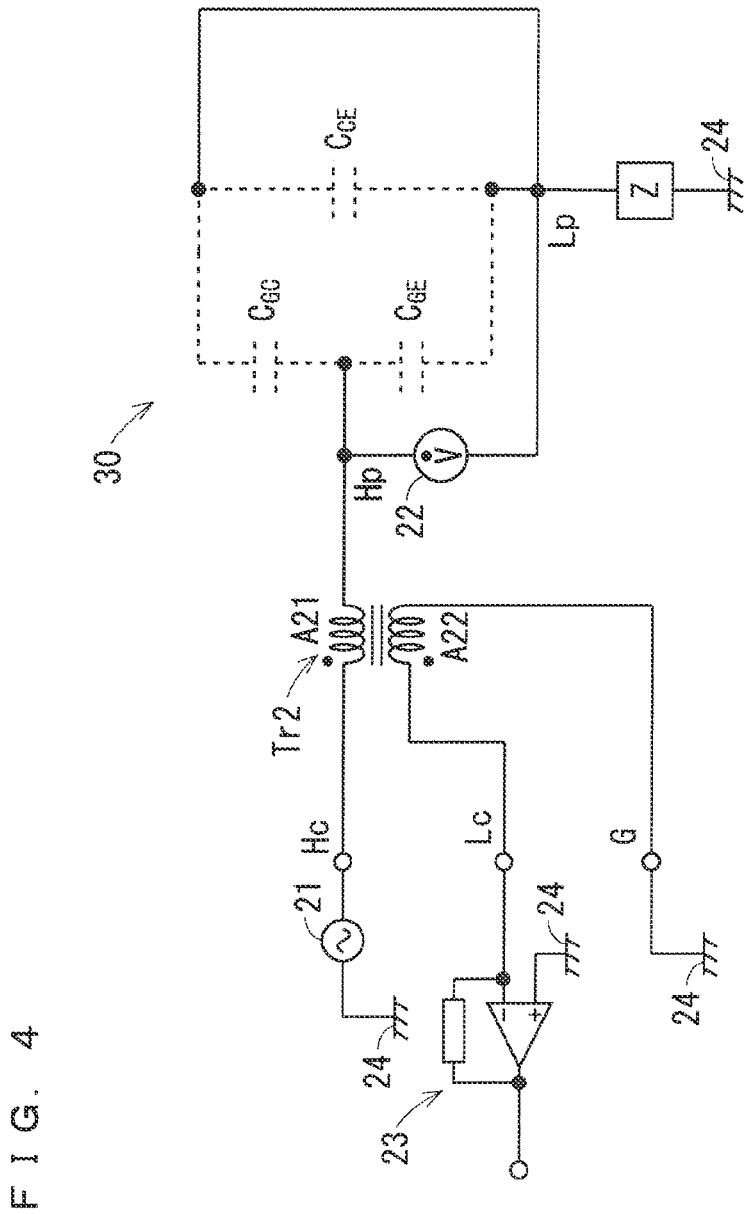
FIG. 4 is a circuit diagram that is a further simplified version of the circuit diagram shown in FIG. 2.

FIG. 4 is a circuit diagram that is a further simplified version of the circuit diagram shown in FIG. 2. An impedance Z shown in FIG. 4 corresponds to impedances between the collector electrode and the signal GND 24 and between the emitter electrode and the signal GND 24. In other words, the impedance Z includes the impedances of the first transformer Tr1, the first capacitor C1, the second capacitor C2, and the third capacitor C3. In FIG. 4, the position of the vector voltmeter 22 of the LCR meter 20 is moved to between the gate and emitter of the IGBT 30.

No current flows through the parasitic capacitance $C_{CE}$ because the collector electrode and the emitter electrode are at the same potential. Thus, the circuit diagram shown in FIG. 4 is further simplified.

Figure 5:
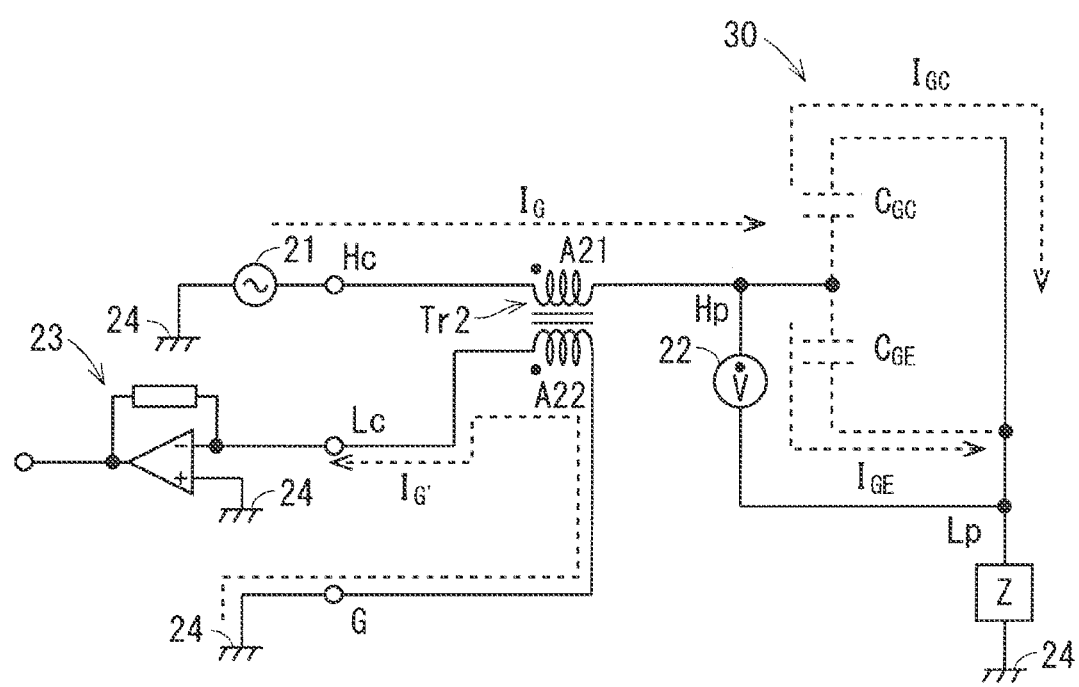
FIG. 5 is a circuit diagram that is a further simplified version of the circuit diagram shown in FIG. 4.

FIG. 5 is a circuit diagram that is a further simplified version of the circuit diagram shown in FIG. 4. The IGBT 30 in the input capacitance measuring state is equivalent to a circuit in which the parasitic capacitance $C_{GE}$ and the parasitic capacitance $C_{GC}$ are connected in parallel to each other.

A high-frequency signal outputted from the signal application terminal Hc of the signal generator 21 causes a signal current $I_G$ to flow through the primary wire A21 of the second transformer Tr2 into the parallel circuit formed by the parasitic capacitances $C_{GE}$ and $C_{GC}$. In the parallel circuit, the signal current $I_G$ is divided into a current $I_{GE}$ flowing through the parasitic capacitance $C_{GE}$ and a current $I_{GC}$ flowing through the parasitic capacitance $C_{GC}$. Then, the signal current $I_G$ obtained by the combination of the currents $I_{GE}$ and $I_{GC}$ flows through the impedance Z into the signal GND 24.

The signal current $I_G$ flows through the primary wire A21 of the second transformer Tr2, whereby a current $I_{G'}$ equal in current value to the signal current $I_G$ flowing through the primary wire A21 flows through the secondary wire A22 of the second transformer Tr2. The current $I_{G'}$ flows from the signal GND 24 through the secondary wire A22 of the second transformer Tr2 into the current measurement terminal Lc. The I-V converter circuit 23 measures the current value of the current $I_{G'}$ and the phase thereof.

The vector voltmeter 22 measures the voltage across the parallel circuit formed by the parasitic capacitances $C_{GE}$ and $C_{GC}$ and the phase thereof when the current $I_G$ flows through the parallel circuit.

The LCR meter 20 measures an input capacitance $C_{iss}$ (=$C_{GC}$+$C_{GE}$) based on the current $I_{G'}$ and the absolute values of its voltage (e.g., the ratio between the absolute values) and the phase difference.

In summary, the input capacitance measurement circuit 101 in the first preferred embodiment measures an input capacitance of a semiconductor device. The input capacitance measurement circuit 101 includes: the first transformer Tr1 including the primary wire A11 and the secondary wire A12; the first capacitor C1; the second capacitor C2; and the third capacitor C3. The first end of the primary wire A11 of the first transformer Tr1 is provided so as to be connectable to the anode of the semiconductor device. The second end of the primary wire A11 of the first transformer Tr1 is connected to the first end of the first capacitor C1. The first end of the secondary wire A12 of the first transformer Tr1 is provided so as to be connectable to the cathode of the semiconductor device. The second end of the secondary wire A12 of the first transformer Tr1 is connected to first end of the second capacitor C2. The first end of the third capacitor C3 is provided so as to be connectable to the cathode of the semiconductor device. The second end of the first capacitor C1, the second end of the second capacitor C2, and the second end of the third capacitor C3 are electrically connected to each other. When the semiconductor device is the IGBT 30, the anode is the collector electrode and the cathode is the emitter electrode. When the semiconductor device is a MOSFET, the anode is a drain electrode and the cathode is a source electrode. Each of the electrodes may be read as a terminal.

It is necessary only that the breakdown voltage of the first capacitor C1 and the breakdown voltage of the second capacitor C2 are higher than the power supply voltage $V_{CC}$. So long as the first capacitor C1 and the second capacitor C2 are equal in capacitance, the capacitance may be low. The dimensions of the first and second capacitors C1 and C2 can be made as small as possible. The input capacitance measurement circuit 101 improves the measurement accuracy of the input capacitance while suppressing an increase in dimensions of the first and second capacitors C1 and C2. In particular, even when the specifications of the semiconductor device are for high voltage, the input capacitance measurement circuit 101 of the first preferred embodiment accurately measures the input capacitance of the semiconductor device.

The input capacitance measurement circuit 101 of the first preferred embodiment is completely unaffected by the bypass capacitor disclosed in Japanese Patent Application Laid-Open No. 2017-090266. The input capacitance measurement circuit 101 is capable of obtaining the true value of the input capacitance, rather than obtaining the approximate value of the input capacitance as in the conventional method. This achieves an improvement in measurement accuracy of the input capacitance as compared with the conventional method.

The method of measuring an input capacitance of a semiconductor device by means of the input capacitance measurement circuit 101 is applied to one of the steps of the manufacture of the semiconductor device. That is, the method of measuring the input capacitance in the first preferred embodiment is a method of manufacturing the semiconductor device. The method of measuring the input capacitance in each preferred embodiment to be described below is also a method of manufacturing the semiconductor device. The semiconductor device at the time of the measurement of the input capacitance may be in any one of the following states: a wafer state in which multiple chips including switching elements are arranged on a wafer, a chip state in which these chips are individually cut into pieces, and a module state in which these chips are sealed in a case. The semiconductor device at the time of the measurement of the input capacitance may be in the state of a finished product. According to the semiconductor device manufacturing method, it is accurately tested that the input capacitance meets the specifications and that the characteristics of the input capacitance do not fluctuate in the steps of the manufacture of the semiconductor device.

Second Preferred Embodiment

In a second preferred embodiment, components similar to those of the first preferred embodiment are designated by the same reference numerals and characters, and will not be described in detail.

Figure 6:
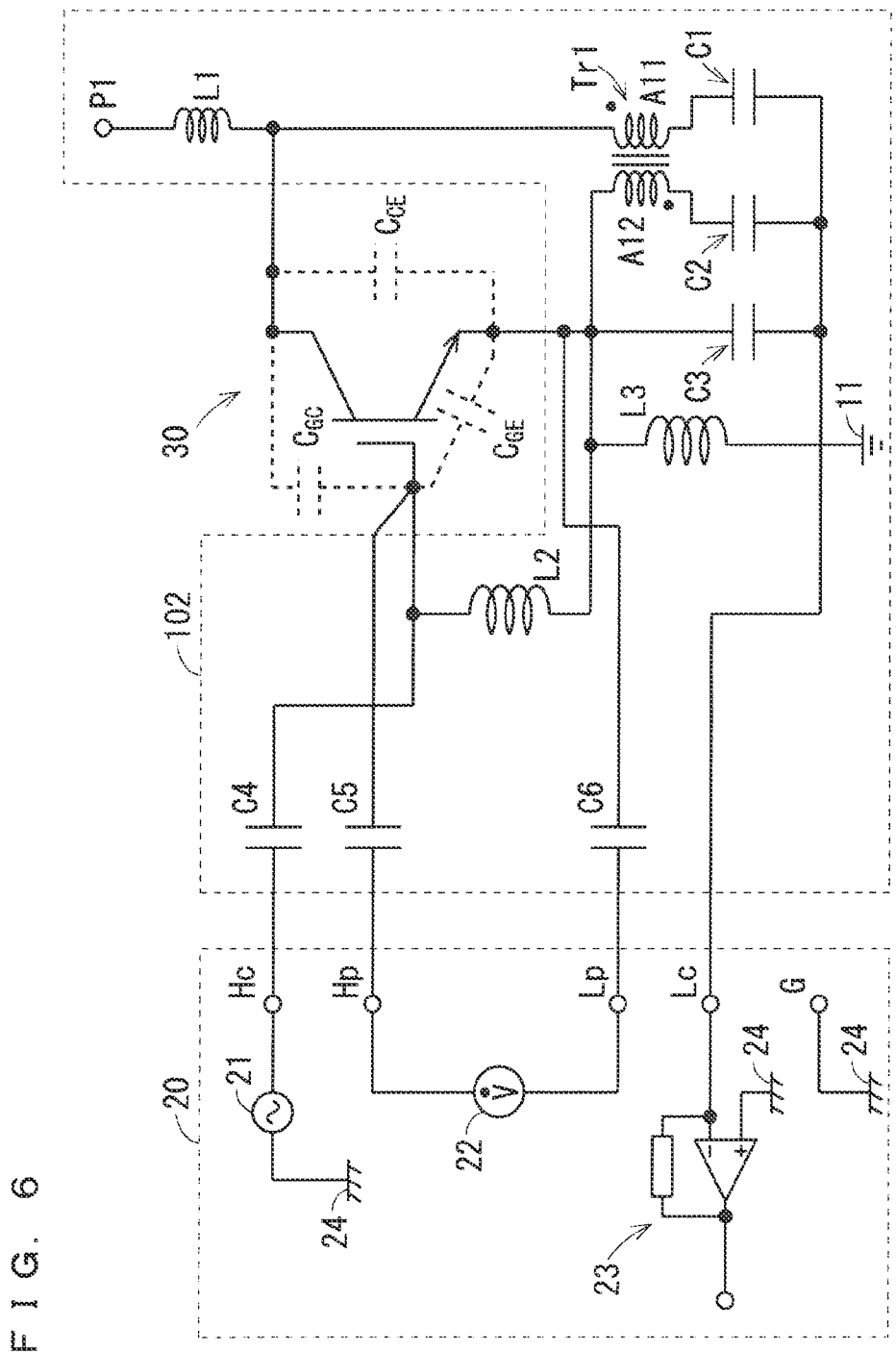
FIG. 6 is a circuit diagram showing a configuration of the input capacitance measurement system according to a second preferred embodiment.

FIG. 6 is a circuit diagram showing a configuration of the input capacitance measurement system according to the second preferred embodiment. The input capacitance measurement system includes an input capacitance measurement circuit 102 and the LCR meter 20.

The input capacitance measurement circuit 102 includes the first to third reactors L1 to L3, the first transformer Tr1, and the first to sixth capacitors C1 to C6. The input capacitance measurement circuit 102 of the second preferred embodiment differs from the input capacitance measurement circuit 101 of the first preferred embodiment in not including the second transformer Tr2 and the seventh capacitor C7. In addition, the connection configuration between the input capacitance measurement circuit 102 and the LCR meter 20 in the second preferred embodiment differs from the connection configuration in the first preferred embodiment.

The number of turns of the primary coil of the first transformer Tr1 is equal to the number of turns of the secondary coil of the first transformer Tr1. The breakdown voltages of the first and second capacitors C1 and C2 are sufficiently higher than the power supply voltage $V_{CC}$. The capacitance of the first capacitor C1 is equal to the capacitance of the second capacitor C2.

The signal application terminal Hc of the signal generator 21 is connected via the fourth capacitor C4 to the gate electrode of the IGBT 30.

The high-side potential measurement terminal Hp of the vector voltmeter 22 is connected via the fifth capacitor C5 to the gate electrode of the IGBT 30. The low-side potential measurement terminal Lp of the vector voltmeter 22 is connected via the sixth capacitor C6 to the emitter electrode of the IGBT 30. In other words, the vector voltmeter 22 is connected to the gate and emitter electrodes of the IGBT 30.

The current measurement terminal Lc of the I-V converter circuit 23 is connected to the second end of the first capacitor C1, the second end of the second capacitor C2, and the second end of the third capacitor C3. The current measurement terminal Lc is connected to the connection point at which the three ends, e.g. the second end of the first capacitor C1, the second end of the second capacitor C2, and the second end of the third capacitor C3, are connected to each other.

The guard terminal G of the signal GND 24 is in an open state.

Next, an operation that the input capacitance measurement system performs on the direct-current power supply will be described. The IGBT 30 is in an off state because the second reactor L2 makes a short circuit between the gate and emitter of the IGBT 30. The direct-current power supply voltage $V_{CC}$ applied between the terminal P1 and the power GND 11 is applied between the collector and emitter electrodes of the IGBT 30 through the first reactor L1 and the third reactor L3. The collector electrode is also connected to the dot-side electrode of the primary wire A11 of the first transformer Tr1, but the first capacitor C1 is connected to the opposite-side electrode of the primary wire A11 of the first transformer Tr1. As a result, the power supply voltage $V_{CC}$ is blocked. In other words, no voltage is applied between both ends, i.e. the dot-side electrode and the opposite-side electrode, of the primary wire A11 of the first transformer Tr1.

Next, an operation that the input capacitance measurement system performs on a high-frequency signal will be described as a method of measuring the input capacitance in the second preferred embodiment. For purposes of simplifying the description of the operation on the high-frequency signal, the operation of the input capacitance measurement system will be described in which the first to third reactors L1 to L3 are regarded as being open and the fourth to sixth capacitors C4 to C6 are regarded as being short-circuited, as in the first preferred embodiment.

Figure 7:
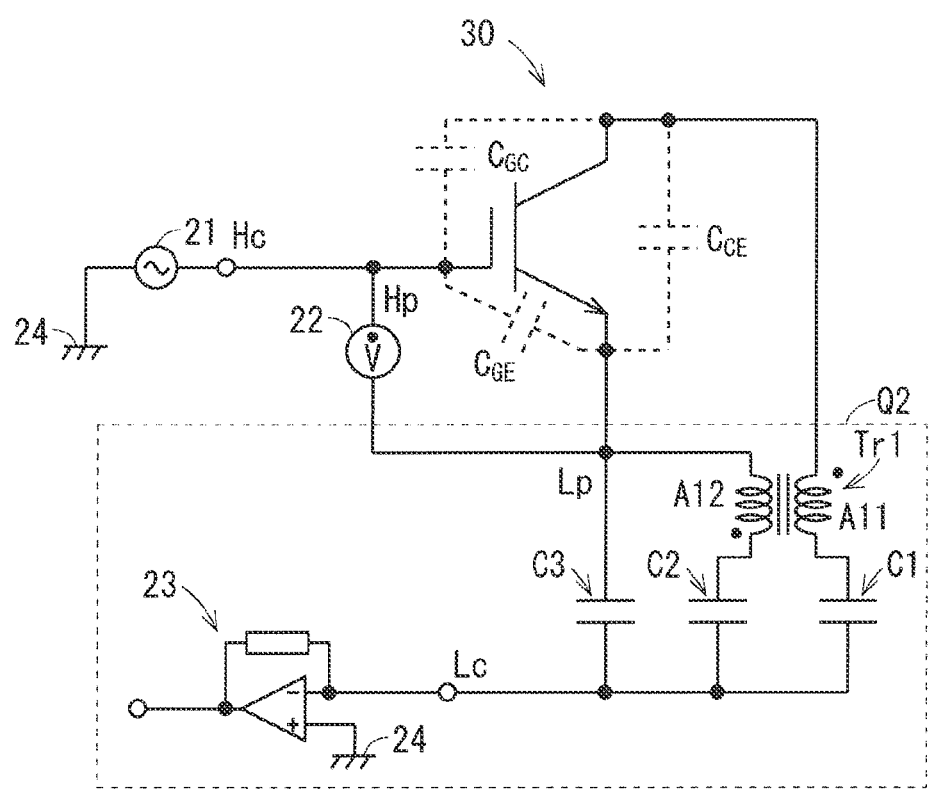
FIG. 7 is a circuit diagram related to an operation that the input capacitance measurement system performs on high-frequency signals.

FIG. 7 is a circuit diagram related to the operation that the input capacitance measurement system performs on high-frequency signals. In FIG. 7, the first to third reactors L1 to L3, the fourth to sixth capacitors C4 to C6, the terminal P1, and the power GND 11 are not shown. In FIG. 7, the positions of the signal generator 21, the vector voltmeter 22, and the I-V converter circuit 23 of the LCR meter 20 are moved to positions suitable for description of the operation.

Figure 8:
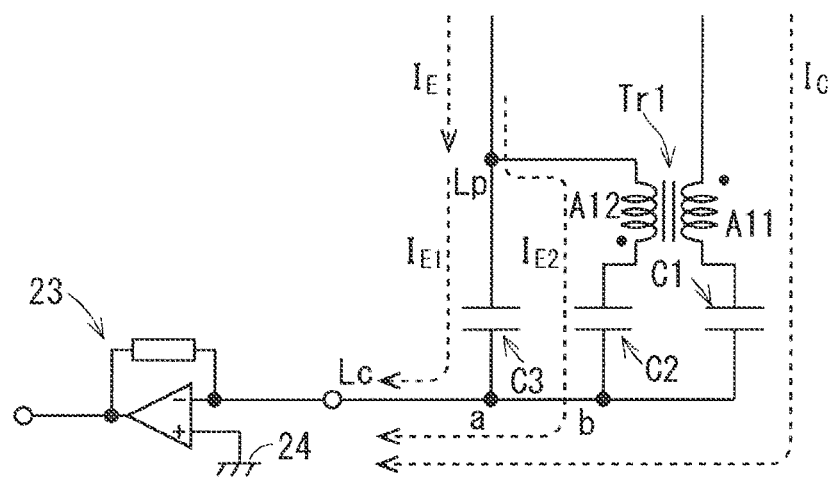
FIG. 8 is an enlarged circuit diagram of a region enclosed by broken lines in FIG. 7.

FIG. 8 is an enlarged circuit diagram of a region Q2 enclosed by broken lines in FIG. 7. The current $I_E$ flowing out of the emitter electrode is divided into the current $I_{E1}$ and the current $I_{E2}$. The current $I_{E1}$ flows through the third capacitor C3 into the current measurement terminal Lc. The current $I_{E2}$ flows through the secondary wire A12 of the first transformer Tr1 and the second capacitor C2 into the current measurement terminal Lc. The current $I_{E2}$ is combined with the current $I_{E1}$ at a point a, and flows into the current measurement terminal Lc. The current $I_C$ flowing out of the collector electrode flows through the primary wire A11 of the first transformer Tr1 and the first capacitor C1 into the current measurement terminal Lc. More specifically, the current $I_C$ is combined with the current $I_{E2}$ at a point b, is combined with the current $I_{E1}$ at the point a, and then flows into the current measurement terminal Lc. That is, the current $I_{E1}$, the current $I_{E2}$, and the current $I_C$ flow into the I-V converter circuit 23. The current $I_{E1}$, the current $I_{E2}$, and the current $I_C$ satisfy the following equation:

$$I_{E1}+I_{E2}+I_C=I_E+I_C \qquad (2)$$

As described in the first preferred embodiment, the collector and emitter electrodes of the IGBT 30 are at the same potential. Thus, the circuit diagram shown in FIG. 7 is further simplified.

Figure 9:
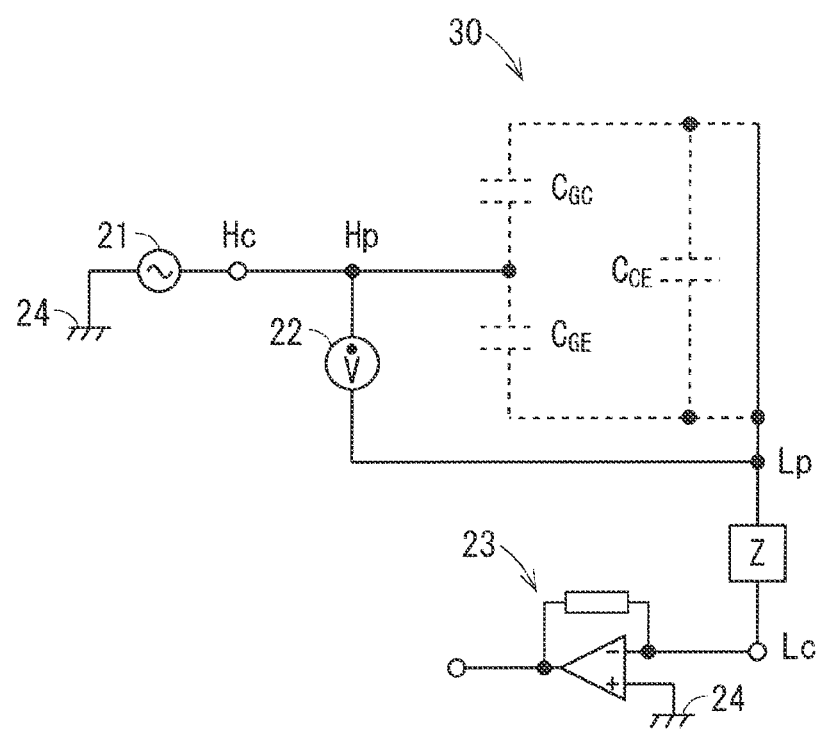
FIG. 9 is a circuit diagram that is a further simplified version of the circuit diagram shown in FIG. 7.

FIG. 9 is a circuit diagram that is a further simplified version of the circuit diagram shown in FIG. 7. The collector and emitter electrodes, which are at the same potential, are short-circuited. The impedance Z shown in FIG. 9 corresponds to impedances between the collector electrode and the current measurement terminal L and between the emitter electrode and the current measurement terminal Lc. In other words, the impedance Z includes the impedances of the first transformer Tr1, the first capacitor C1, the second capacitor C2, and the third capacitor C3.

No current flows through the parasitic capacitance $C_{CE}$ because the collector electrode and the emitter electrode are at the same potential. Thus, the circuit diagram shown in FIG. 9 is further simplified.

Figure 10:
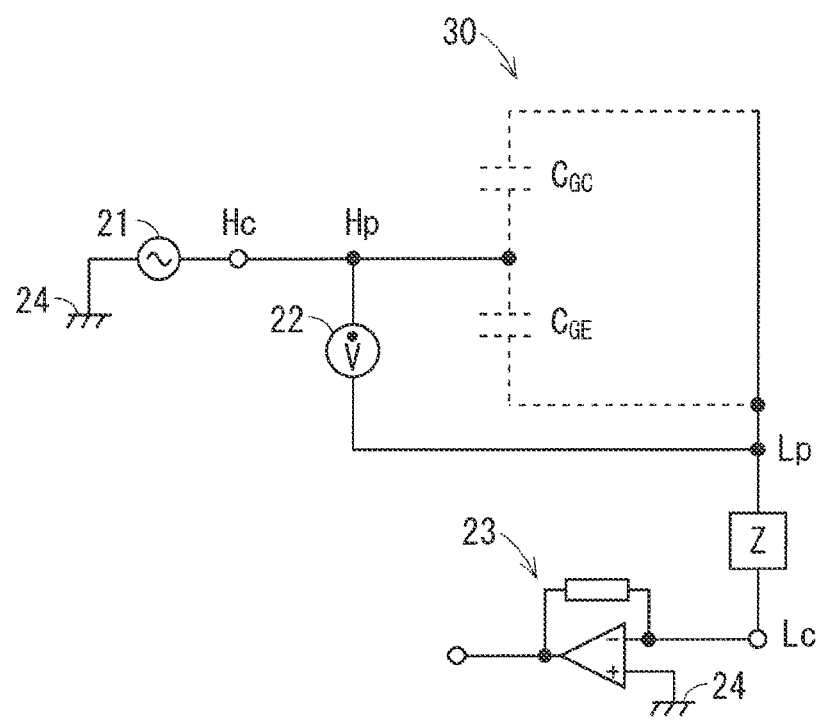
FIG. 10 is a circuit diagram that is a further simplified version of the circuit diagram shown in FIG. 9.

FIG. 10 is a circuit diagram that is a further simplified version of the circuit diagram shown in FIG. 9. The IGBT 30 in the input capacitance measuring state is equivalent to a circuit in which the parasitic capacitance $C_{GE}$ and the parasitic capacitance $C_{GC}$ are connected in parallel to each other.

A high-frequency signal outputted from the signal application terminal Hc of the signal generator 21 causes a signal current to flow into the parallel circuit formed by the parasitic capacitances $C_{GE}$ and $C_{GC}$. In the parallel circuit, the signal current is divided into a current flowing through the parasitic capacitance $C_{GE}$ and a current flowing through the parasitic capacitance $C_{GC}$. Then, the signal current outputted from the parallel circuit and then combined flows through the impedance Z into the current measurement terminal Lc. The I-V converter circuit 23 measures the current value of the signal current and the phase thereof.

The vector voltmeter 22 measures the voltage across the parallel circuit formed by the parasitic capacitances $C_{GE}$ and $C_{GC}$ and the phase thereof when the signal current flows through the parallel circuit.

The LCR meter 20 measures the input capacitance $C_{iss}$ ($=C_{GC}+C_{GE}$) based on the absolute values of the signal current and its voltage and the phase difference.

It is necessary only that the breakdown voltage of the first capacitor C1 and the breakdown voltage of the second capacitor C2 are higher than the power supply voltage $V_{CC}$. So long as the first capacitor C1 and the second capacitor C2 are equal in capacitance, the capacitance may be low. The dimensions of the first and second capacitors C1 and C2 can be made as small as possible. The input capacitance measurement circuit 102 improves the measurement accuracy of the input capacitance while suppressing an increase in dimensions of the first and second capacitors C1 and C2.

The input capacitance measurement circuit 102 of the second preferred embodiment is completely unaffected by the bypass capacitor disclosed in Japanese Patent Application Laid-Open No. 2017-090266. This achieves an improvement in measurement accuracy of the input capacitance as compared with the conventional method.

Third Preferred Embodiment

In a third preferred embodiment, components similar to those of the first or second preferred embodiment are designated by the same reference numerals and characters, and will not be described in detail.

Figure 11:
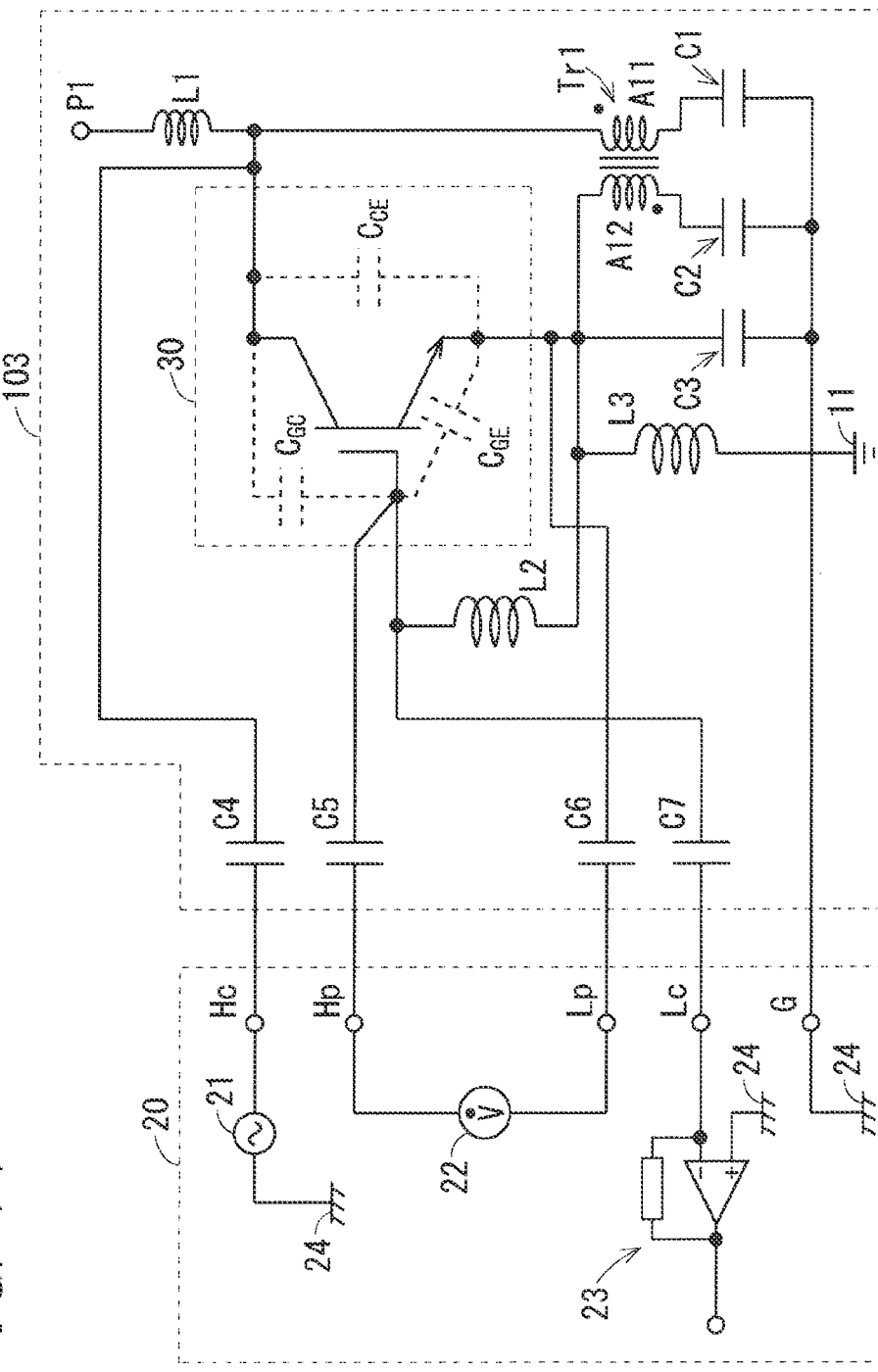
FIG. 11 is a circuit diagram showing a configuration of the input capacitance measurement system according to a third preferred embodiment.

FIG. 11 is a circuit diagram showing a configuration of the input capacitance measurement system according to the third preferred embodiment. The input capacitance measurement system includes an input capacitance measurement circuit 103 and the LCR meter 20.

The input capacitance measurement circuit 103 includes the first to third reactors L1 to L3, the first transformer Tr1, and the first to seventh capacitors C1 to C7. When compared with the input capacitance measurement circuit 102 of the second preferred embodiment, the input capacitance measurement circuit 103 of the third preferred embodiment further includes the seventh capacitor C7. In addition, the connection configuration between the input capacitance measurement circuit 103 and the LCR meter 20 in the third preferred embodiment differs from the connection configuration in the second preferred embodiment. Other circuit configurations of the third preferred embodiment are identical with those of the second preferred embodiment.

The signal application terminal Hc of the signal generator 21 is connected via the fourth capacitor C4 to the collector electrode of the IGBT 30.

The high-side potential measurement terminal Hp of the vector voltmeter 22 is connected via the fifth capacitor C5 to the gate electrode of the IGBT 30. The low-side potential measurement terminal Lp of the vector voltmeter 22 is connected via the sixth capacitor C6 to the emitter electrode of the IGBT 30. In other words, the vector voltmeter 22 is connected to the gate and emitter electrodes of the IGBT 30.

The current measurement terminal Lc of the I-V converter circuit 23 is connected via the seventh capacitor C7 to the gate electrode of the IGBT 30.

The guard terminal G of the signal GND 24 is connected to the second end of the first capacitor C1, the second end of the second capacitor C2, and the second end of the third capacitor C3. The current measurement terminal Lc is connected to the connection point at which the three ends, e.g. the second end of the first capacitor C1, the second end of the second capacitor C2, and the second end of the third capacitor C3, are connected to each other.

Next, an operation that the input capacitance measurement system performs on the direct-current power supply will be described. The IGBT 30 is in an off state because the second reactor L2 makes a short circuit between the gate and emitter of the IGBT 30. The direct-current power supply voltage $V_{CC}$ applied between the terminal P1 and the power GND 11 is applied between the collector and emitter electrodes of the IGBT 30 through the first reactor L1 and the third reactor L3. The collector electrode is also connected to the dot-side electrode of the primary wire A11 of the first transformer Tr1, but the first capacitor C1 is connected to the opposite-side electrode of the primary wire A11 of the first transformer Tr1. As a result, the power supply voltage $V_{CC}$ is blocked. In other words, no voltage is applied between both ends, i.e. the dot-side electrode and the opposite-side electrode, of the primary wire A11 of the first transformer Tr1.

Next, an operation that the input capacitance measurement system performs on a high-frequency signal will be described as a method of measuring the input capacitance in the third preferred embodiment. For purposes of simplifying the description of the operation on the high-frequency signal, the operation of the input capacitance measurement system will be described in which the first to third reactors L1 to L3 are regarded as being open and the fourth to seventh capacitors C4 to C7 are regarded as being short-circuited, as in the first or second preferred embodiment.

FIG. 12 is a circuit diagram related to the operation that the input capacitance measurement system performs on high-frequency signals. In FIG. 12, the first to third reactors L1 to L3, the fourth to seventh capacitors C4 to C7, the terminal P1, and the power GND 11 are not shown. In FIG. 12, the positions of the signal generator 21, the vector voltmeter 22, the I-V converter circuit 23, and the signal GND 24 of the LCR meter 20 are moved to positions suitable for description of the operation.

As in the first preferred embodiment, the collector and emitter electrodes of the IGBT 30 are at the same potential. Thus, the circuit diagram shown in FIG. 12 is further simplified.

Figure 13:
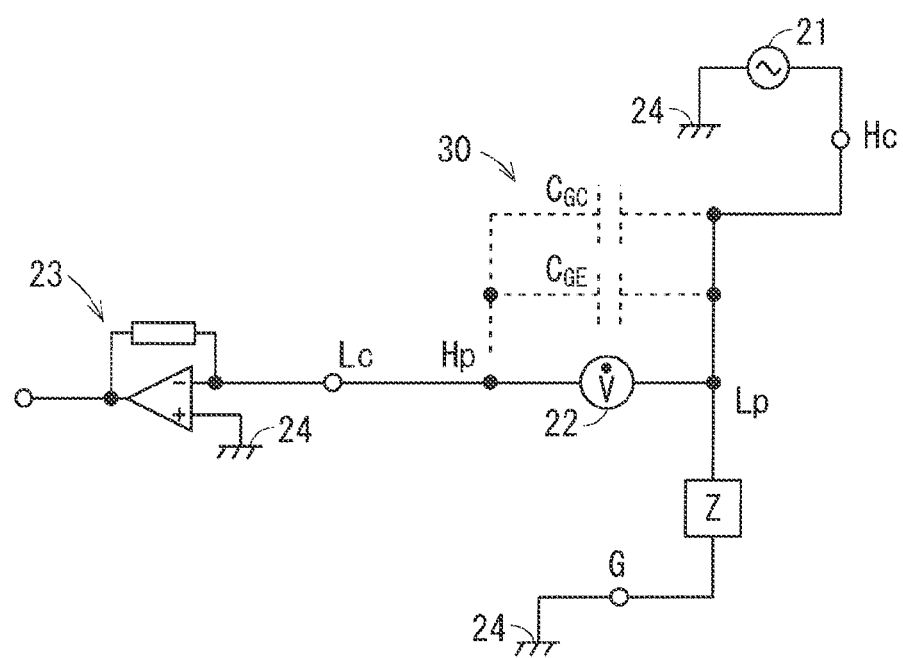
FIG. 13 is a circuit diagram that is a further simplified version of the circuit diagram shown in FIG. 12.

FIG. 13 is a circuit diagram that is a further simplified version of the circuit diagram shown in FIG. 12. The collector and emitter electrodes, which are at the same potential, are short-circuited. The impedance Z shown in FIG. 13 corresponds to impedances between the collector electrode and the signal GND 24 and between the emitter electrode and the signal GND 24. In other words, the impedance Z includes the impedances of the first transformer Tr1, the first capacitor C1, the second capacitor C2, and the third capacitor C3.

No current flows through the parasitic capacitance $C_{CE}$ because the collector electrode and the emitter electrode are at the same potential. Thus, the IGBT 30 in the input capacitance measuring state is equivalent to a circuit in which the parasitic capacitance $C_{GE}$ and the parasitic capacitance $C_{GC}$ are connected in parallel to each other.

A high-frequency signal outputted from the signal application terminal Hc of the signal generator 21 causes part of the signal current to flow into the parallel circuit formed by the parasitic capacitances $C_{GE}$ and $C_{GC}$. Other parts of the signal current flow into the impedance Z. The signal current outputted from the parallel circuit flows into the current measurement terminal Lc. The I-V converter circuit 23 measures the current value of the signal current and the phase thereof.

The vector voltmeter 22 measures the voltage across the parallel circuit formed by the parasitic capacitances $C_{GE}$ and $C_{GC}$ when part of the signal current flows through and the phase of the voltage.

The LCR meter 20 measures the input capacitance $C_{iss}$ (=$C_{GC}$+$C_{GE}$) based on the absolute values of the signal current and its voltage and the phase difference.

It is necessary only that the breakdown voltages of the first and second capacitors C1 and C2 are higher than the power supply voltage $V_{CC}$. So long as the first capacitor C1 and the second capacitor C2 are equal in capacitance, the capacitance may be low. The dimensions of the first and second capacitors C1 and C2 can be made as small as possible. The input capacitance measurement circuit 103 improves the measurement accuracy of the input capacitance while suppressing an increase in dimensions of the first and second capacitors C1 and C2.

The input capacitance measurement circuit 103 of the third preferred embodiment is completely unaffected by the bypass capacitor disclosed in Japanese Patent Application Laid-Open No. 2017-090266. This achieves an improvement in measurement accuracy of the input capacitance as compared with the conventional method.

Fourth Preferred Embodiment

In a fourth preferred embodiment, components similar to those of any one of the first to third preferred embodiments are designated by the same reference numerals and characters, and will not be described in detail.

Figure 14:
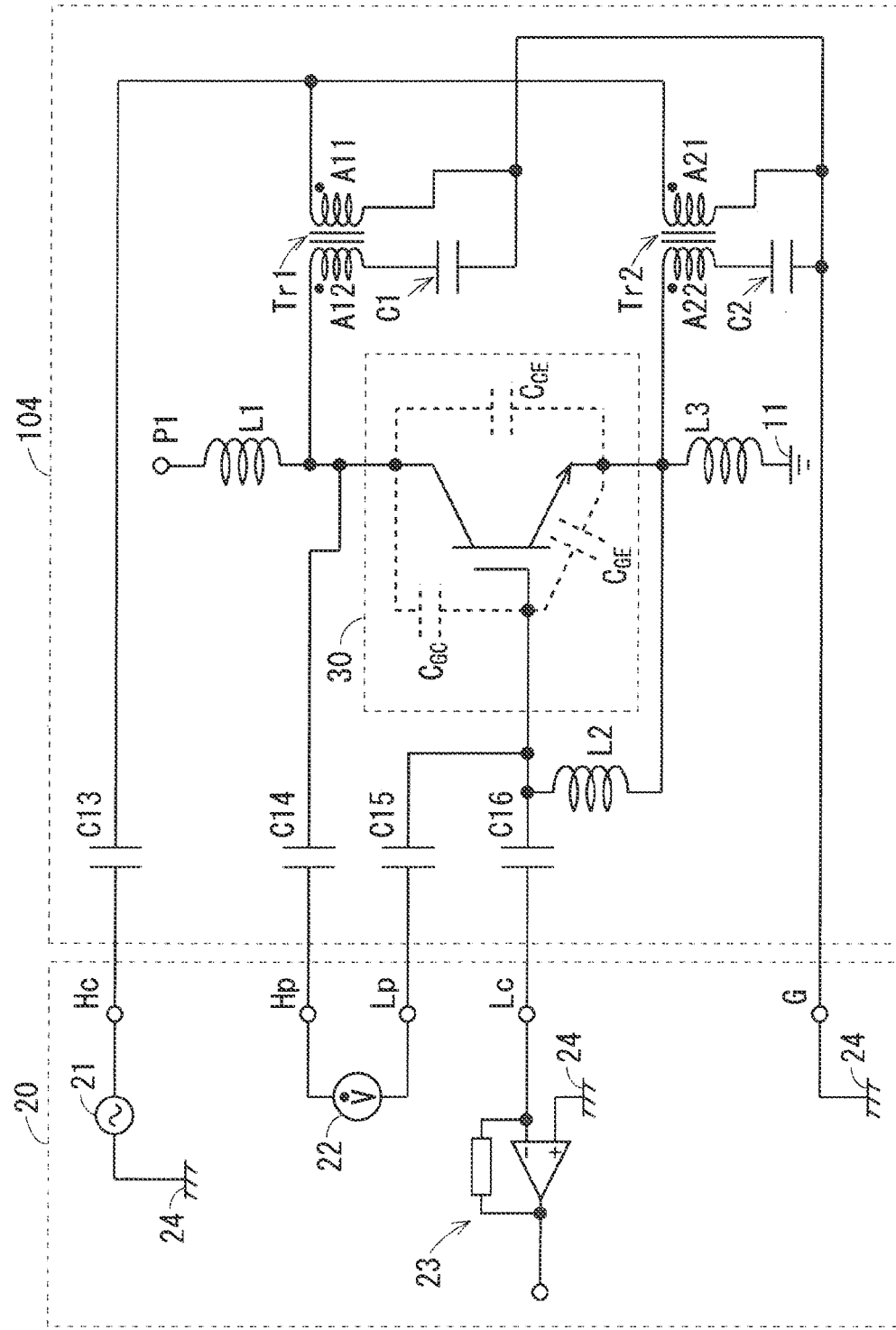
FIG. 14 is a circuit diagram showing a configuration of the input capacitance measurement system according to a fourth preferred embodiment.

FIG. 14 is a circuit diagram showing a configuration of the input capacitance measurement system according to the fourth preferred embodiment. The input capacitance measurement system includes an input capacitance measurement circuit 104 and the LCR meter 20.

The input capacitance measurement circuit 104 includes the first to third reactors L1 to L3, the first transformer Tr1, the second transformer Tr2, the first capacitor C1, the second capacitor C2, and third to sixth capacitors C13 to C16. Each of the capacitors is, for example, a block capacitor, but is not limited to the block capacitor.

The first reactor L1 connects the terminal P1 and the collector electrode of the IGBT 30. The terminal P1 is a terminal for applying the power supply voltage $V_{CC}$ that is a high direct-current voltage. The first reactor L1 blocks high-frequency signals.

The second reactor L2 connects the gate and emitter electrodes of the IGBT 30. The second reactor L2 blocks high-frequency signals.

The third reactor L3 connects the emitter electrode of the IGBT 30 and the power GND 11. The third reactor L3 blocks high-frequency signals.

The first transformer Tr1 includes the primary wire A11 and the secondary wire A12. The second transformer Tr2 includes the primary wire A21 and the secondary wire A22. Each of the primary wires A11 and A21 includes a primary coil, and each of the secondary wires A12 and A22 includes a secondary coil.

The dot-side electrode of the primary wire A11 of the first transformer Tr1 is connected to the dot-side electrode of the primary wire A21 of the second transformer Tr2. That is, the first end of the primary wire A11 of the first transformer Tr1 is connected to the first end of the primary wire A21 of the second transformer Tr2.

The opposite-side electrode of the primary wire A11 of the first transformer Tr1 is connected to the opposite-side electrode of the primary wire A21 of the second transformer Tr2. That is, the second end of the primary wire A11 of the first transformer Tr1 is connected to the second end of the primary wire A21 of the second transformer Tr2.

The dot-side electrode of the secondary wire A12, i.e. the first end of the secondary wire A12, of the first transformer Tr1 is connected to the collector electrode of the IGBT 30.

The opposite-side electrode of the secondary wire A12, i.e. the second end of the secondary wire A12, of the first transformer Tr1 is connected to the first end of the first capacitor C1.

The second end of the first capacitor C1 is connected to the opposite-side electrode of the secondary wire A12, i.e. the second end of the secondary wire A12, of the first transformer Tr1.

The dot-side electrode of the secondary wire A22, i.e. the first end of the secondary wire A22, of the second transformer Tr2 is connected to the emitter electrode of the IGBT 30.

The opposite-side electrode of the secondary wire A22, i.e. a second end of the secondary wire A22, of the second transformer Tr2 is connected to the first end of the second capacitor C2.

The second end of the second capacitor C2 is connected to the opposite-side electrode of the primary wire A21, i.e. the second end of the primary wire A21, of the second transformer Tr2.

The opposite-side electrode of the primary wire A11 of the first transformer Tr1, the second end of the first capacitor C1, the opposite-side electrode of the primary wire A21 of the second transformer Tr2, and the second end of the second capacitor C2 are electrically connected to each other and are at the same potential.

The number of turns of the primary coil of the first transformer Tr1 is equal to the number of turns of the primary coil of the second transformer Tr2. The number of turns of the primary coil of the first transformer Tr1 is equal to the number of turns of the secondary coil of the first transformer Tr1. The number of turns of the primary coil of the second transformer Tr2 is equal to the number of turns of the secondary coil of the second transformer Tr2.

The breakdown voltages of the first and second capacitors C1 and C2 are sufficiently higher than the power supply voltage $V_{CC}$ applied between the terminal P1 and the power GND 11. The capacitance of the first capacitor C1 is equal to the capacitance of the second capacitor C2.

The signal application terminal Hc of the signal generator 21 is connected via the third capacitor C13 to the dot-side electrode of the primary wire A11 of the first transformer Tr1 and the dot-side electrode of the primary wire A21 of the second transformer Tr2. That is, the signal application terminal Hc is connected to the first end of the primary wire A11 of the first transformer Tr1 and the first end of the primary wire A21 of the second transformer Tr2.

The high-side potential measurement terminal Hp of the vector voltmeter 22 is connected via the fourth capacitor C14 to the collector electrode of the IGBT 30. The low-side potential measurement terminal Lp of the vector voltmeter 22 is connected via the fifth capacitor C15 to the gate electrode of the IGBT 30. In other words, the vector voltmeter 22 is connected to the collector and gate electrodes of the IGBT 30.

The current measurement terminal Lc of the I-V converter circuit 23 is connected via the sixth capacitor C16 to the gate electrode of the IGBT 30.

The guard terminal G of the signal GND 24 is connected to the opposite-side electrode of the primary wire A11 of the first transformer Tr1, the second end of the first capacitor C1, the opposite-side electrode of the primary wire A21 of the second transformer Tr2, and the second end of the second capacitor C2.

In FIG. 14 which shows the connection configuration in the input capacitance measuring state, the input capacitance measurement circuit 104 is connected to the IGBT 30. However, the input capacitance measurement circuit 104 need not be connected to the IGBT 30 in states other than the input capacitance measuring state. The input capacitance measurement circuit 104 may have a terminal (not shown)

connectable to the IGBT 30. For example, there may be provided a terminal for connection between the dot-side electrode of the secondary wire A12 of the first transformer Tr1 and the collector electrode. There may be provided a terminal for connection between the dot-side electrode of the secondary wire A22 of the second transformer Tr2 and the emitter electrode. The same applies to the connection between the input capacitance measurement circuit 104 and the LCR meter 20. The input capacitance measurement circuit 104 may have a terminal (not shown) for connection to the LCR meter 20 in states other than the input capacitance measuring state.

Next, an operation that the input capacitance measurement system performs on the direct-current power supply will be described. The IGBT 30 is in an off state because the second reactor L2 makes a short circuit between the gate and emitter of the IGBT 30. The direct-current power supply voltage $V_{CC}$ applied between the terminal P1 and the power GND 11 is applied between the collector and emitter electrodes of the IGBT 30 through the first reactor L1 and the third reactor L3. The collector electrode is also connected to the dot-side electrode of the secondary wire A12 of the first transformer Tr1, but the first capacitor C1 is connected to the opposite-side electrode of the secondary wire A12 of the first transformer Tr1. As a result, the power supply voltage $V_{CC}$ is blocked. In other words, no voltage is applied between both ends, i.e. the dot-side electrode and the opposite-side electrode, of the secondary wire A12 of the first transformer Tr1.

Next, an operation that the input capacitance measurement system performs on a high-frequency signal will be described as a method of measuring the input capacitance in the fourth preferred embodiment. For purposes of simplifying the description of the operation on the high-frequency signal, the operation of the input capacitance measurement system will be described in which the first to third reactors L1 to L3 are regarded as being open and the third to sixth capacitors C13 to C16 are regarded as being short-circuited, as in the first preferred embodiment.

Figure 15:
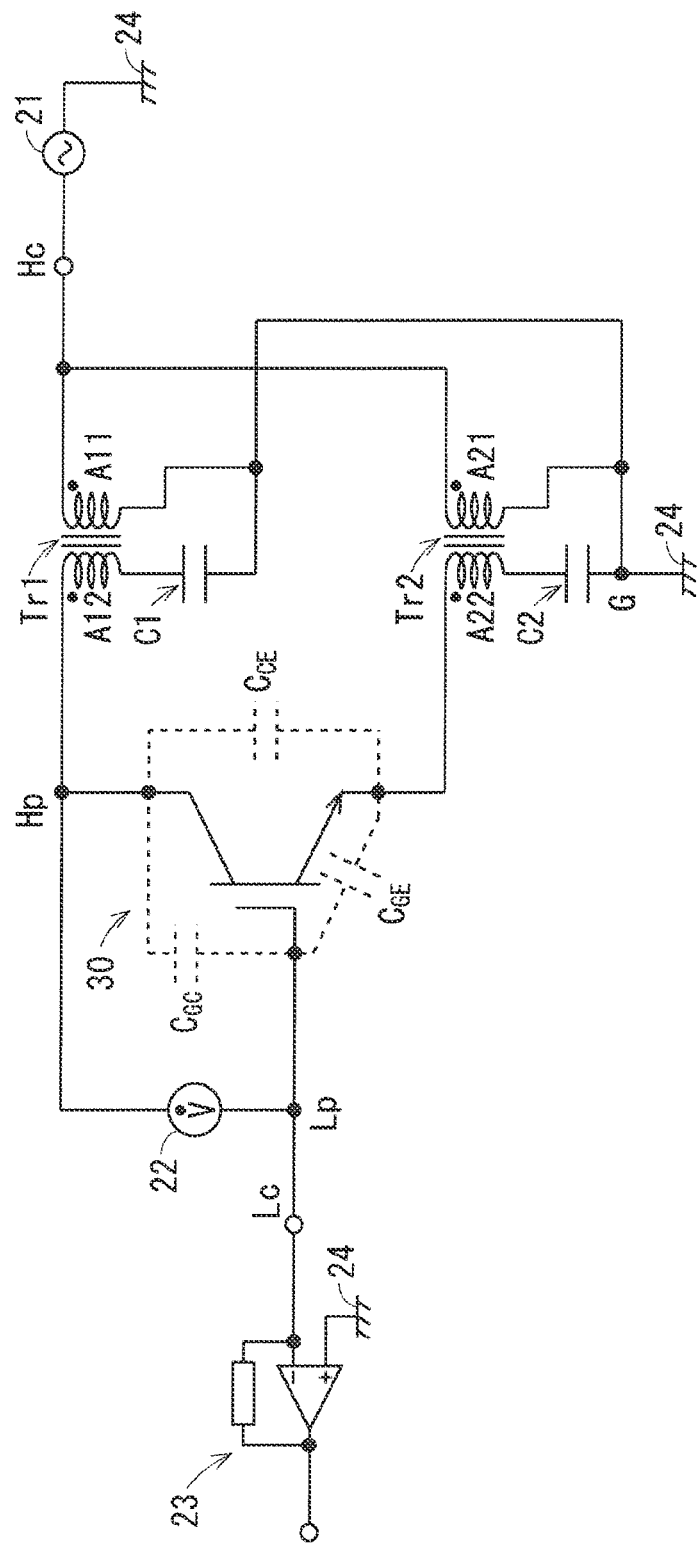
FIG. 15 is a circuit diagram related to an operation that the input capacitance measurement system performs on high-frequency signals.

FIG. 15 is a circuit diagram related to the operation that the input capacitance measurement system performs on high-frequency signals. In FIG. 15, the first to third reactors L1 to L3, the third to sixth capacitors C13 to C16, the terminal P1, and the power GND) 11 are not shown. In FIG. 15, the positions of the signal generator 21, the vector voltmeter 22, the I-V converter circuit 23, and the signal GND 24 of the LCR meter 20 are moved to positions suitable for description of the operation.

A high-frequency signal is outputted from the signal application terminal Hc of the signal generator 21 to the dot-side electrode of the primary wire A11 of the first transformer Tr1 and the dot-side electrode of the primary wire A21 of the second transformer Tr2.

The primary wire A11 of the first transformer Tr1 and the primary wire A21 of the second transformer Tr2 are connected in parallel to each other. A connection point between the opposite-side electrode of the primary wire A11 of the first transformer Tr1 and the opposite-side electrode of the primary wire A21 of the second transformer Tr2 is connected to the signal GND 24. Thus, a voltage applied across the primary wire A11 of the first transformer Tr1 is equal to a voltage applied across the primary wire A21 of the second transformer Tr2. A signal voltage developed across the secondary wire A12 of the first transformer Tr1 is equal to a signal voltage developed across the secondary wire A22 of the second transformer Tr2 because the number of turns of the primary coil of the first transformer Tr1 is equal to the number of turns of the primary coil of the second transformer Tr2. A signal voltage developed between the collector electrode of the IGBT 30 and the signal GND 24 is equal to a signal voltage developed between the emitter electrode of the IGBT 30 and the signal GND 24 because the capacitance of the first capacitor C1 is equal to the capacitance of the second capacitor C2. Thus, the circuit diagram shown in FIG. 15 is simplified.

Figure 16:
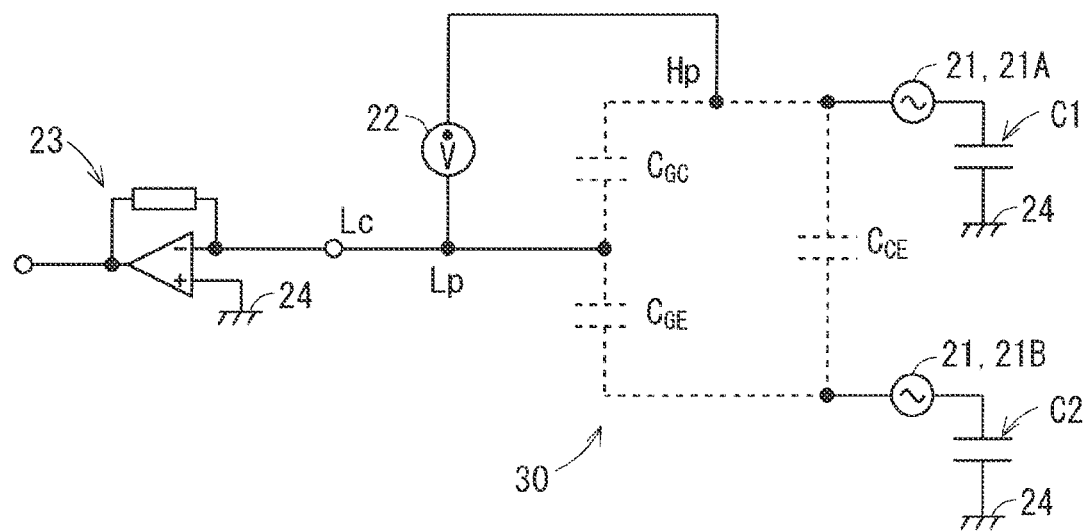
FIG. 16 is a circuit diagram that is a simplified version of the circuit diagram shown in FIG. 15.

FIG. 16 is a circuit diagram that is a simplified version of the circuit diagram shown in FIG. 15. For convenience of description, the signal generator 21 is shown as divided into two: a signal generator 21A that outputs a high-frequency signal to the first transformer Tr1 and a signal generator 21B that outputs a high-frequency signal to the second transformer Tr2. No current flows through the parasitic capacitance $C_{CE}$ because the collector electrode and the emitter electrode are at the same potential. Thus, the circuit diagram shown in FIG. 16 is further simplified.

Figure 17:
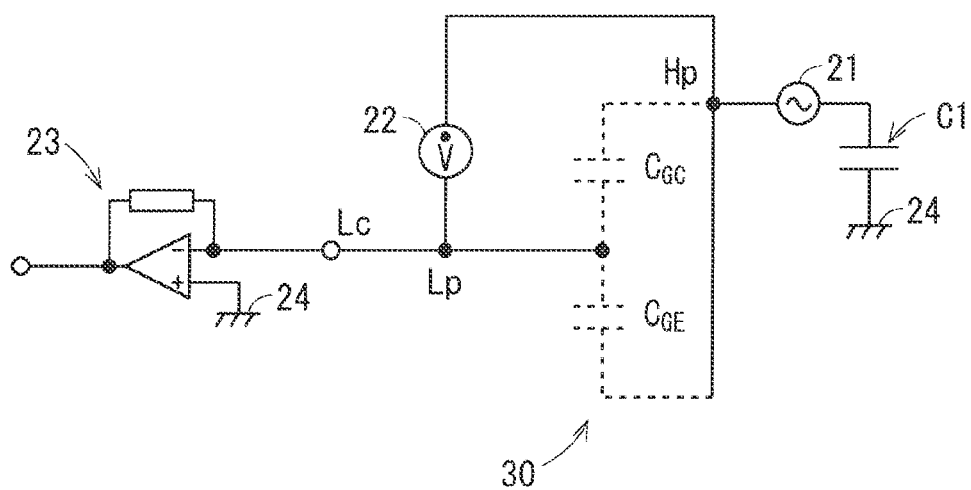
FIG. 17 is a circuit diagram that is a further simplified version of the circuit diagram shown in FIG. 16.

FIG. 17 is a circuit diagram that is a further simplified version of the circuit diagram shown in FIG. 16. The collector electrode and the emitter electrode are short-circuited. In addition, the two signal generators 21A and 21B are shown as combined again in the form of the single signal generator 21.

A high-frequency signal outputted from the signal application terminal Hc of the signal generator 21 causes a signal current to flow into the parallel circuit formed by the parasitic capacitances $C_{GE}$ and $C_{GC}$. The signal current is divided into a current flowing through the parasitic capacitance $C_{GE}$ and a current flowing through the parasitic capacitance $C_{GC}$. Then, the signal current outputted from the parallel circuit and then combined flows into the current measurement terminal Lc. The I-V converter circuit 23 measures the current value of the signal current and the phase thereof.

The vector voltmeter 22 measures the voltage across the parallel circuit formed by the parasitic capacitances $C_{GE}$ and $C_{GC}$ and the phase thereof when the signal current flows through the parallel circuit.

The LCR meter 20 measures the input capacitance $C_{iss}$ ($=C_{GC}+C_{GE}$) based on the absolute values of the signal current and its voltage and the phase difference.

The input capacitance measurement circuit 104 of the fourth preferred embodiment produces effects similar to those of the input capacitance measurement circuit described in any one of the first to third preferred embodiments.

Fifth Preferred Embodiment

In a fifth preferred embodiment, components similar to those of any one of the first to third preferred embodiments are designated by the same reference numerals and characters, and will not be described in detail.

Figure 18:
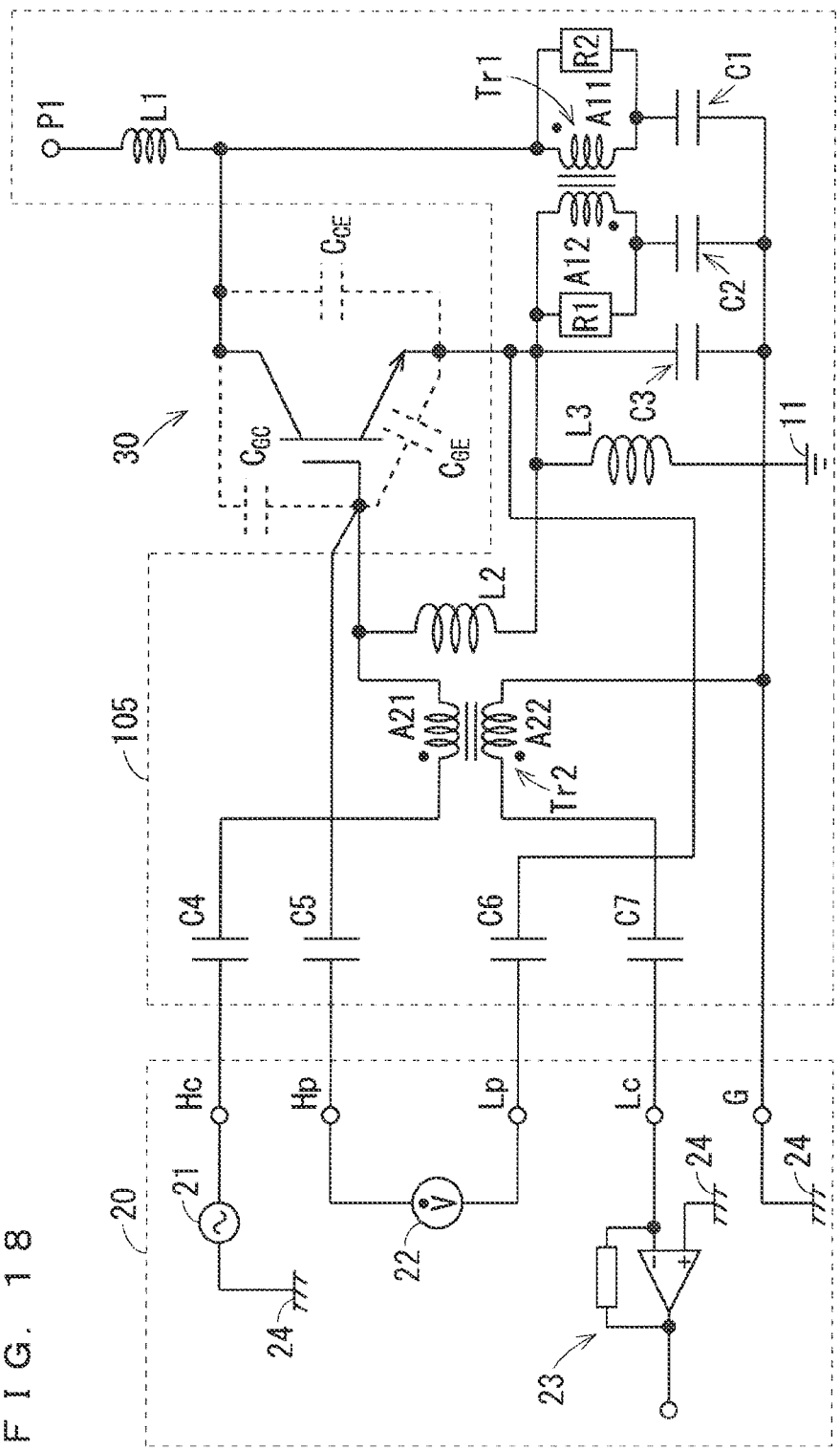
FIG. 18 is a circuit diagram showing a configuration of the input capacitance measurement system according to a fifth preferred embodiment.

FIG. 18 is a circuit diagram showing a configuration of the input capacitance measurement system according to the fifth preferred embodiment. The input capacitance measurement system includes an input capacitance measurement circuit 105 and the LCR meter 20.

Figure 19:
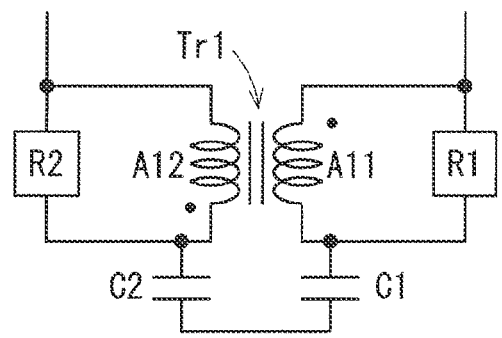
FIG. 19 is a circuit diagram on an enlarged scale showing part of an input capacitance measurement circuit according to the fifth preferred embodiment.

FIG. 19 is a circuit diagram on an enlarged scale showing part of the input capacitance measurement circuit 105 of the fifth preferred embodiment. FIG. 19 shows a circuit diagram in the vicinity of the first transformer Tr1, the first capacitor C1, and the second capacitor C2.

The input capacitance measurement circuit 105 further includes a first resistor R1 and a second resistor R2 in addition to the components of the input capacitance measurement circuit 101 described in the first preferred embodiment. Other components of the fifth preferred embodiment are similar to those of the first preferred embodiment.

The first resistor R1 connects the dot-side and opposite-side electrodes of the primary wire A11 of the first transformer Tr1. The second resistor R2 connects the dot-side and opposite-side electrodes of the secondary wire A12 of the first transformer Tr1. The first resistor R1 is equal in resistance to the second resistor R2. The first resistor R1 and the second resistor R2 are precision low-resistors.

Current flowing through the primary and secondary wires A11 and A12 of the first transformer Tr1 will be described below in detail.

When the number of turns of the primary coil is equal to the number of turns of the secondary coil, the voltage across the primary wire A11 is always equal to the voltage across the secondary wire A12. Also, the value of current flowing through the primary wire A11 is usually equal to the value of current flowing through the secondary wire A12.

Figure 20:
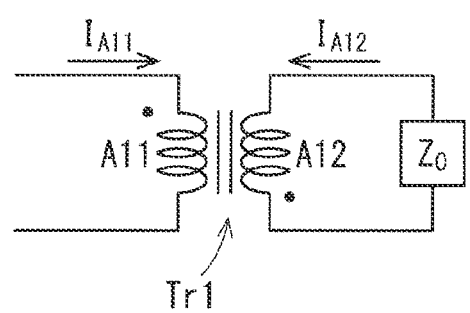
FIG. 20 is a circuit diagram illustrating currents flowing through a primary wire and a secondary wire.

FIG. 20 is a circuit diagram illustrating the currents flowing through the primary wire A11 and the secondary wire A12. In the circuit diagram of FIG. 20, a current $I_{A11}$ through the primary wire A11 and a current $I_{A12}$ through the secondary wire A12 satisfy the following equation:

$$I_{A12} = j\omega M/(j\omega L_{A12} + Z_0) \times I_{A11} \quad (3)$$

where M is a mutual inductance, and $L_{A12}$ is the self-inductance of the secondary wire A12 in the case where the primary wire A11 is open.

The primary and secondary wires A11 and A12 of the first transformer Tr1 are tightly coupled to each other and hence satisfy the following equation:

$$M^2 L_{A11} \times L_{A12} \quad (4)$$

where $L_{A11}$ is the self-inductance of the primary wire A11 in the case where the secondary wire A12 is open.

Since the number of turns of the primary coil is equal to the number of turns of the secondary coil, satisfied are the following equations:

$$L_{A11} = L_{A12} \quad (5)$$

and $$M = L_{A11} = L_{A12} \quad (6)$$

Equation (3) is transformed into the following equation:

$$I_{A12} = j\omega L_{A12}/(j\omega L_{A12} + Z_0) \times I_{A11} \quad (7)$$

When the primary wire A11 is open, the impedance $j\omega L_{A12}$ generated by the inductance $L_{A12}$ of the secondary wire A12 is negligibly larger than the impedance $Z_0$ connected across the secondary wire A12. That is, the relationship $j\omega L_{A12} \gg Z_0$ holds. Thus, $I_{A12} = I_{A11}$ is derived from Equation (7).

However, the lower a measurement frequency is, the smaller the impedance $j\omega L_{A12}$ is. Thus, the relationship $j\omega L_{A12} \gg Z_0$ no longer holds, and there arises a difference between the currents $I_{A12}$ and $I_{A11}$.

Figure 21:
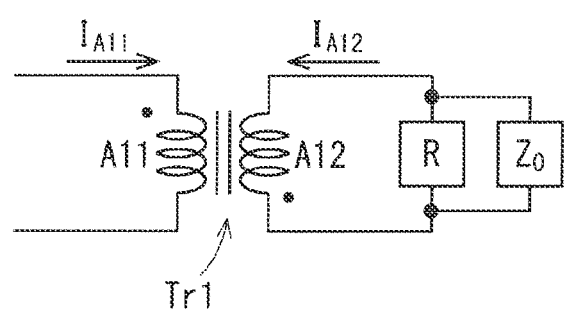
FIG. 21 is a circuit diagram showing a precision low-resistor connected across the secondary wire.

FIG. 21 is a circuit diagram showing a precision low-resistor connected across the secondary wire A12. The precision low-resistor has a resistance R such that the relationship $R \ll \omega L_{A12}$ holds even when the measurement frequency is the lowest.

When the precision low-resistor is connected across the secondary wire A12, the relationship between the current $I_{A11}$ and the current $I_{A12}$ satisfies the following equation:

$$I_{A12} = j\omega L_{A12}/(j\omega L_{A12} + Z) \times I_{A11} \quad (8)$$

where the impedance Z denotes a value obtained when the impedance $Z_0$ and the precision low-resistor are connected in parallel.

That is, the following relationship holds:

$$Z = R \times Z_0/(R + Z_0) \quad (9)$$

If $R > Z$ always holds and $\omega L_{A12} \gg R$, then $\omega L_{A12} \gg Z$ holds.

Thus, $I_{A11} = I_{A12}$ is derived from Equation (8).

Even when the inductance $L_{A12}$ of the secondary wire A12 and the inductance $L_{A11}$ of the primary wire A11 become smaller as the measurement frequency decreases, currents equal in value flow through the primary wire A11 and the secondary wire A12 because of the first resistor R1 connected across the primary wire A11 and the second resistor R2 connected across the secondary wire A12. This achieves an improvement in measurement accuracy of the input capacitance.

The input capacitance measurement circuit 105 of the fifth preferred embodiment is capable of reducing the size of the first transformer Tr1 and improving the accuracy of the input capacitance even when the measurement frequency is low.

The first and second resistors R1 and R2 shown in FIG. 18 are applicable to the input capacitance measurement circuits 102 and 103 of the second and third preferred embodiments. This application produces effects similar to those described above.

In the present disclosure, the preferred embodiments may be freely combined or the preferred embodiments may be changed and dispensed with, as appropriate.

While the disclosure has been shown and described in detail, the foregoing description is in all aspects illustrative and not restrictive. It is therefore understood that numerous modifications and variations can be devised.

What is claimed is:

1. An input capacitance measurement circuit for measuring an input capacitance of a semiconductor device, comprising:
    a transformer including a primary wire and a secondary wire;
    a first capacitor;
    a second capacitor; and
    a third capacitor,
    the primary wire of the transformer having a first end provided so as to be connectable to an anode of the semiconductor device,
    the primary wire of the transformer having a second end connected to a first end of the first capacitor,
    the secondary wire of the transformer having a first end provided so as to be connectable to a cathode of the semiconductor device,
    the secondary wire of the transformer having a second end connected to a first end of the second capacitor,
    the third capacitor having a first end provided so as to be connectable to the cathode of the semiconductor device,
    wherein a second end of the first capacitor, a second end of the second capacitor, and a second end of the third capacitor are electrically connected to each other.

2. The input capacitance measurement circuit according to claim 1,
    wherein the number of turns of a primary coil included in the primary wire of the transformer is equal to the number of turns of a secondary coil included in the secondary wire of the transformer.

3. The input capacitance measurement circuit according to claim 1, wherein the first capacitor is equal in capacitance to the second capacitor.

4. The input capacitance measurement circuit according to claim 1,
wherein the anode and the cathode correspond to a collector electrode and an emitter electrode, respectively, of the semiconductor device or correspond to a drain electrode and a source electrode, respectively, of the semiconductor device.

5. The input capacitance measurement circuit according to claim 1, further comprising:
a first resistor that connects the first and second ends of the primary wire of the transformer; and
a second resistor that connects the first and second ends of the secondary wire of the transformer,
wherein the first resistor is equal in resistance to the second resistor.

6. The input capacitance measurement circuit according to claim 1, further comprising
a current signal generating transformer including a primary wire and a secondary wire,
the primary wire of the current signal generating transformer having a first end provided so as to be connectable to a gate electrode of the semiconductor device,
the secondary wire of the current signal generating transformer having a first end electrically connected to the second end of the first capacitor, the second end of the second capacitor, and the second end of the third capacitor.

7. A method of manufacturing a semiconductor device for measuring the input capacitance of the semiconductor device by means of an input capacitance measurement circuit as recited in claim 6, comprising:
connecting the first end of the primary wire of the transformer to the anode of the semiconductor device;
connecting the first end of the secondary wire of the transformer and the first end of the third capacitor to the cathode of the semiconductor device;
connecting the first end of the primary wire of the current signal generating transformer to the gate electrode of the semiconductor device;
electrically connecting the first end of the secondary wire of the current signal generating transformer to the second end of the first capacitor, the second end of the second capacitor, and the second end of the third capacitor;
connecting a second end of the primary wire of the current signal generating transformer to a signal generator of an LCR meter;
connecting the gate electrode and the cathode of the semiconductor device to a voltmeter of the LCR meter;
connecting a second end of the secondary wire of the current signal generating transformer to a current-to-voltage converter circuit of the LCR meter;
connecting the second end of the first capacitor, the second end of the second capacitor, and the second end of the third capacitor to a ground of the LCR meter;
applying a high-frequency signal from the signal generator of the LCR meter to the gate electrode of the semiconductor device;
measuring a current flowing from the ground through the current signal generating transformer into the current-to-voltage converter circuit as a current flowing from the gate electrode through the anode and the cathode of the semiconductor device into the input capacitance measurement circuit;
measuring a voltage between the gate electrode and the cathode of the semiconductor device by means of the voltmeter; and
measuring the input capacitance of the semiconductor device, based on the current and the voltage.

8. The method according to claim 7,
wherein a signal application terminal of the signal generator is connected via a fourth capacitor to the second end of the primary wire of the current signal generating transformer,
wherein a first potential measurement terminal of the voltmeter is connected via a fifth capacitor to the gate electrode of the semiconductor device,
wherein a second potential measurement terminal of the voltmeter is connected via a sixth capacitor to the cathode of the semiconductor device, and
wherein a current measurement terminal of the current-to-voltage converter circuit is connected via a seventh capacitor to the second end of the secondary wire of the current signal generating transformer.

9. A method of manufacturing a semiconductor device for measuring the input capacitance of the semiconductor device by means of an input capacitance measurement circuit as recited in claim 1, comprising:
connecting the first end of the primary wire of the transformer to the anode of the semiconductor device;
connecting the first end of the secondary wire of the transformer and the first end of the third capacitor to the cathode of the semiconductor device;
connecting a gate electrode of the semiconductor device to a signal generator of an LCR meter;
connecting the gate electrode and the cathode of the semiconductor device to a voltmeter of the LCR meter;
connecting the second end of the first capacitor, the second end of the second capacitor, and the second end of the third capacitor to a current-to-voltage converter circuit of the LCR meter;
applying a high-frequency signal from the signal generator of the LCR meter to the gate electrode of the semiconductor device;
measuring a current flowing from the gate electrode through the anode and the cathode of the semiconductor device and through the input capacitance measurement circuit into the current-to-voltage converter circuit;
measuring a voltage between the gate electrode and the cathode of the semiconductor device by means of the voltmeter; and
measuring the input capacitance of the semiconductor device, based on the current and the voltage.

10. The method according to claim 9,
wherein a signal application terminal of the signal generator is connected via a fourth capacitor to the gate electrode,
wherein a first potential measurement terminal of the voltmeter is connected via a fifth capacitor to the gate electrode, and
wherein a second potential measurement terminal of the voltmeter is connected via a sixth capacitor to the cathode.

11. A method of manufacturing a semiconductor device for measuring the input capacitance of the semiconductor device by means of an input capacitance measurement circuit as recited in claim 1, comprising:
connecting the first end of the primary wire of the transformer to the anode of the semiconductor device;

connecting the first end of the secondary wire of the transformer and the first end of the third capacitor to the cathode of the semiconductor device;

connecting the anode of the semiconductor device to a signal generator of an LCR meter;

connecting a gate electrode and the cathode of the semiconductor device to a voltmeter of the LCR meter;

connecting the gate electrode of the semiconductor device to a current-to-voltage converter circuit of the LCR meter;

connecting the second end of the first capacitor, the second end of the second capacitor, and the second end of the third capacitor to a ground of the LCR meter;

applying a high-frequency signal from the signal generator of the LCR meter to the anode;

measuring a current flowing from the anode through the cathode and the gate electrode of the semiconductor device into the current-to-voltage converter circuit;

measuring a voltage between the gate electrode and the cathode of the semiconductor device by means of the voltmeter; and measuring the input capacitance of the semiconductor device, based on the current and the voltage.

12. The method according to claim 11,
wherein a signal application terminal of the signal generator is connected via a fourth capacitor to the anode,
wherein a first potential measurement terminal of the voltmeter is connected via a fifth capacitor to the gate electrode, and
wherein a second potential measurement terminal of the voltmeter is connected via a sixth capacitor to the cathode.

13. An input capacitance measurement circuit for measuring an input capacitance of a semiconductor device, comprising:
a first transformer including a primary wire and a secondary wire;
a second transformer including a primary wire and a secondary wire;
a first capacitor; and
a second capacitor,
the primary wire of the first transformer having a first end connected to a first end of the primary wire of the second transformer,
the secondary wire of the first transformer having a first end provided so as to be connectable to an anode of the semiconductor device,
the secondary wire of the first transformer having a second end connected to a first end of the first capacitor,
the secondary wire of the second transformer having a first end provided so as to be connectable to a cathode of the semiconductor device,
the secondary wire of the second transformer having a second end connected to a first end of the second capacitor,
wherein a second end of the primary wire of the first transformer, a second end of the first capacitor, a second end of the primary wire of the second transformer, and a second end of the second capacitor are electrically connected to each other.

14. The input capacitance measurement circuit according to claim 13,
wherein the number of turns of a primary coil included in the primary wire of the first transformer is equal to the number of turns of a primary coil included in the primary wire of the second transformer.

15. The input capacitance measurement circuit according to claim 14,
wherein the number of turns of the primary coil of the first transformer is equal to the number of turns of a secondary coil included in the secondary wire of the first transformer, and
wherein the number of turns of the primary coil of the second transformer is equal to the number of turns of a secondary coil included in the secondary wire of the second transformer.

16. The input capacitance measurement circuit according to claim 13,
wherein the first capacitor is equal in capacitance to the second capacitor.

17. The input capacitance measurement circuit according to claim 13,
wherein the anode and the cathode correspond to a collector electrode and an emitter electrode, respectively, of the semiconductor device or correspond to a drain electrode and a source electrode, respectively, of the semiconductor device.

18. A method of manufacturing a semiconductor device for measuring the input capacitance of the semiconductor device by means of an input capacitance measurement circuit as recited in claim 13, comprising:
connecting the first end of the secondary wire of the first transformer to the anode of the semiconductor device;
connecting the first end of the secondary wire of the second transformer to the cathode of the semiconductor device;
connecting the first end of the primary wire of the first transformer and the first end of the primary wire of the second transformer to a signal generator of an LCR meter;
connecting a gate electrode and the anode of the semiconductor device to a voltmeter of the LCR meter;
connecting the gate electrode of the semiconductor device to a current-to-voltage converter circuit of the LCR meter;
connecting the second end of the primary wire of the first transformer, the second end of the first capacitor, the second end of the primary wire of the second transformer, and the second end of the second capacitor to a ground of the LCR meter;
applying a high-frequency signal from the signal generator of the LCR meter to the first end of the primary wire of the first transformer and the first end of the primary wire of the second transformer;
measuring a current flowing from the anode and the cathode of the semiconductor device through the gate electrode into the current-to-voltage converter circuit;
measuring a voltage between the gate electrode and the anode of the semiconductor device by means of the voltmeter; and
measuring the input capacitance of the semiconductor device, based on the current and the voltage.

19. The method according to claim 18,
wherein a signal application terminal of the signal generator is connected via a third capacitor to the first end of the primary wire of the first transformer and the first end of the primary wire of the second transformer;
wherein a first potential measurement terminal of the voltmeter is connected via a fourth capacitor to the anode of the semiconductor device,
wherein a second potential measurement terminal of the voltmeter is connected via a fifth capacitor to the gate electrode of the semiconductor device, wherein a current measurement terminal of the current-to-voltage converter circuit is connected via a sixth capacitor to the gate electrode of the semiconductor device, and wherein a guard terminal of the LCR meter connected to the ground is connected to the second end of the primary wire of the first transformer, the second end of the first capacitor, the second end of the primary wire of the second transformer, and the second end of the second capacitor.

* * * * *